(12) United States Patent
Orihara et al.

(10) Patent No.: US 9,005,876 B2
(45) Date of Patent: Apr. 14, 2015

(54) POSITIVE PHOTOSENSITIVE RESIN COMPOSITION FOR SPRAY COATING AND METHOD FOR PRODUCING THROUGH ELECTRODE USING THE SAME

(71) Applicant: Sumitomo Bakelite Co., Ltd., Tokyo (JP)

(72) Inventors: Hideki Orihara, Tokyo (JP); Toshio Banba, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 14/135,721

(22) Filed: Dec. 20, 2013

(65) Prior Publication Data

US 2014/0113448 A1    Apr. 24, 2014

Related U.S. Application Data

(62) Division of application No. 13/124,126, filed as application No. PCT/JP2009/067838 on Oct. 15, 2009, now abandoned.

(30) Foreign Application Priority Data

Oct. 20, 2008 (JP) .................... 2008-269824

(51) Int. Cl.
*G03F 7/26* (2006.01)
*H01L 21/768* (2006.01)
(Continued)

(52) U.S. Cl.
CPC .......... H01L 21/76825 (2013.01); C08G 73/22 (2013.01); C09D 7/001 (2013.01);
(Continued)

(58) Field of Classification Search
CPC ............... H01L 2924/14; H01L 2225/06541; H01L 24/19; H01L 24/02; H01L 24/11; H01L 21/76897; H01L 21/76879; H01L 2224/83191; H01L 23/49827; H01L 24/27; H01L 21/312; H01L 21/76831; H01L 21/00; H01L 27/10888; H01F 2017/002
USPC ............................................. 430/270.1, 311
See application file for complete search history.

(56) References Cited

U.S. PATENT DOCUMENTS 5,891,606 A * 4/1999 Brown ......................... 430/312
2003/0143480 A1   7/2003 Ueda et al.
(Continued)

FOREIGN PATENT DOCUMENTS

CN      1656427      8/2005
EP      1329769      7/2003
(Continued)

OTHER PUBLICATIONS

Pham, et al., "Spray Coating of Photoresist for Realizing Through-Wafer Interconnects", Electronics Packaging Technology Conference, 2006, pp. 831-836.
(Continued)

*Primary Examiner* — Caleen Sullivan
(74) *Attorney, Agent, or Firm* — Ditthavong & Steiner, P.C.

(57) ABSTRACT

A method for producing a through electrode includes providing a semiconductor wafer having an integrated circuit provided on a surface of the semiconductor wafer and a hole provided in the semiconductor wafer along a thickness direction of the semiconductor wafer. At least a portion of a back surface of an electrode of the integrated circuit is exposed through the hole. A positive photosensitive resin composition is sprayed to form a coating film so that the coating film covers an inner surface of the hole. The positive photosensitive resin composition has a viscosity of 0.5 to 200 cP and includes an alkali-soluble resin, a compound which generates an acid when exposed to light, and a solvent. At least a portion of the coating film is exposed and developed to form a coating film pattern.

15 Claims, 3 Drawing Sheets

(51) Int. Cl.
| | | |
|---|---|---|
| *C08G 73/22* | (2006.01) | |
| *C09D 7/00* | (2006.01) | |
| *C09D 179/04* | (2006.01) | |
| *C09D 179/08* | (2006.01) | |
| *H01L 21/312* | (2006.01) | |
| *G03F 7/004* | (2006.01) | |
| *G03F 7/023* | (2006.01) | |
| *G03F 7/16* | (2006.01) | |

(52) U.S. Cl.
CPC ........... *C09D 179/04* (2013.01); *C09D 179/08* (2013.01); *H01L 21/312* (2013.01); *H01L 21/76898* (2013.01); *G03F 7/0048* (2013.01); *G03F 7/0233* (2013.01); *G03F 7/16* (2013.01); *H01L 21/76831* (2013.01)

(56) References Cited

U.S. PATENT DOCUMENTS

| | | | |
|---|---|---|---|
| 2005/0266334 A1 | 12/2005 | Banba et al. | |
| 2006/0191708 A1* | 8/2006 | Kawasaki et al. | 174/255 |
| 2010/0193971 A1 | 8/2010 | Banba et al. | |

FOREIGN PATENT DOCUMENTS

| | | |
|---|---|---|
| EP | 1491952 | 12/2004 |
| EP | 1508837 | 2/2005 |
| JP | 60-024545 | 2/1985 |
| JP | 2001-255654 | 9/2001 |
| JP | 2002-223058 | 8/2002 |
| JP | 2003-243396 | 8/2003 |
| JP | 2006-147873 | 6/2006 |
| JP | 2007-183388 | 7/2007 |
| JP | 09-218517 | 8/2007 |
| JP | 2007-305955 | 11/2007 |
| JP | 2008-040324 | 2/2008 |
| JP | 2008-091857 | 4/2008 |
| WO | 2008/123049 | 10/2008 |
| WO | 2009/014113 | 1/2009 |

OTHER PUBLICATIONS

Chung, et al. "Simulation of Structure Profiles in Optical Lithography of Thick DNQ-Novolak Based Photoresists", Advances in Resist Technology and Processing XVII, Proceedings of SPIE, 2000, pp. 1226-1235, vol. 3999, Germany.
International Search Report for International Application No. PCT/JP2009/067838, Nov. 17, 2009.
Written Opinion of the International Searching Authority for International Application No. PCT/JP2009/067838, Nov. 17, 2009.
Chinese Office Action for corresponding CN Application No. 200980140757.8, Jun. 14, 2012.
Supplementary European Search Report for corresponding EP Application No. 09821961, Dec. 14, 2012.
Machine translation JP 2001-255654. Sep. 21, 2001.
Translation JP 60-024545. Feb. 7, 1985.
Machine translation of Japanese Application JP 2008-040324 A, Feb. 21, 2008.

* cited by examiner

POSITIVE PHOTOSENSITIVE RESIN COMPOSITION FOR SPRAY COATING AND METHOD FOR PRODUCING THROUGH ELECTRODE USING THE SAME

CROSS-REFERENCE TO RELATED APPLICATIONS

The present application is a divisional application of the U.S. patent application Ser. No. 13/124,126, which in turn is a national stage application of International Application No. PCT/JP2009/067838, filed Oct. 15, 2009, which claims priority to Japanese Patent Application No. 2008-269824, filed on Oct. 20, 2008. The contents of these applications are incorporated herein by reference in their entirety.

BACKGROUND OF THE INVENTION

1. Field of the Invention

The present invention relates to a positive photosensitive resin composition for spray coating for forming a coating film by spray coating on the inner surface of a hole provided in the thickness direction of a semiconductor wafer. Further, the present invention relates to a method for producing a through electrode for electrically connecting an integrated circuit provided on the surface of a semiconductor wafer and a connecting terminal provided on the back surface of the semiconductor wafer, comprising the step of forming a coating film pattern on the inner surface of a hole using the composition.

2. Discussion of the Background

Recently, as the need for high-functional performance and miniaturization of electronic devices has been increased, the technique for high-density package of semiconductor integrated circuits has been developed. As one of such packaging techniques, attention is focused on the three-dimensional packaging technique in which a semiconductor integrated circuit is laminated using a through electrode formed in the thickness direction of a semiconductor wafer.

As a method for forming a through electrode, for example, a method in which: an insulating film is formed on the inner surface of a non-through hole provided on the surface of a semiconductor wafer; the interior of the hole is filled with a conductive material; after that, the semiconductor wafer is shaved from the back surface side (back grind); and thereby the conductive material embedded in the hole is exposed, is known (for example, see Japanese Laid-Open Patent Publication No. 2006-147873; and Japanese Laid-Open Patent Publication No. 2008-91857). However, this method requires a high cost since it is necessary to make a deep hole in a thick wafer in order to carry out back grind later. In addition, there is a limitation on the ratio of depth/diameter of a hole (aspect ratio) that can be formed in a semiconductor wafer. In order to make a deep hole, a large diameter is required. It is impossible to make many holes at narrow intervals, and there are wasteful areas.

Meanwhile, a method in which: an integrated circuit is formed on the surface of a semiconductor wafer; after that, a hole, which passes through from the back surface of the semiconductor wafer to reach the integrated circuit on the surface of the semiconductor wafer, is made; an insulating film is formed to cover the inner surface of the hole; an electrode portion of the integrated circuit is exposed; and after that, an conductive material is embedded, thereby forming a through electrode, is known (for example, see Japanese Laid-Open Patent Publication No. 2007-305955).

Conventionally, in the case where an integrated circuit is formed on the surface of a semiconductor wafer and thereafter a hole which reaches the back surface of an electrode portion of the integrated circuit is provided to form a through electrode, a method in which a $SiO_2$ film is formed on the inner surface of the hole using the vapor deposition method and thereafter the $SiO_2$ film on the back surface of the electrode portion is subjected to etch back, thereby exposing the back surface of the electrode portion, is used. However, it is difficult to form a vapor-deposited film having a uniform thickness on the inner surface of a very small-sized hole having a high aspect ratio, and the thickness of the vapor-deposited film at the deep portion of the hole becomes thinner. Therefore, at the time of etch back, a part of the film is etched to expose a metal wiring, a conductive portion of semiconductor wafer or the like, and leakage current is generated to cause decrease of a yield rate.

Meanwhile, methods for forming an insulating film by spray coating have been suggested. For example, in Japanese Laid-Open Patent Publication No. 2006-147873, a method for forming an insulating film on the inner wall of a hole formed in the thickness direction of a semiconductor wafer by spraying a mist comprising an insulating material from a spray nozzle with the average diameter of the mist being changed is suggested. However, the type of an insulating material must be selected in consideration of adhesion to wall surfaces, heat resistance, electrical insulation property, etc. A selected material may not be solved in a diluting solvent appropriate for spray coating or may be degenerated. It is difficult to form a coating film having a uniform thickness on the inner surface of a hole of a semiconductor wafer only by employing an original idea for a coating method.

SUMMARY OF THE INVENTION

Under the above-described circumstances, it is desired to provide a positive photosensitive resin composition which enables formation of a coating film having a uniform thickness on the inner surface of a hole having a high aspect ratio. Further, it is desired to provide a method for forming a through electrode, with a high yield, in the thickness direction of a semiconductor wafer on which an integrated circuit is provided.

The present inventors diligently made researches in order to solve the above-described problems, and found that a uniform coating film can be formed on the inner surface of a hole formed in the thickness direction of a semiconductor wafer by using a composition, which comprises: an alkali-soluble resin; a compound which generates an acid when exposed to light; and a solvent, and which has a predetermined viscosity. In addition, the present inventors found that, since only a desired region can be exposed by exposing and developing an obtained coating film, it is possible to form a through electrode with leakage current generated in the hole being suppressed. Thus, the present invention was achieved.

According to one aspect of the present invention, a method for producing a through electrode for electrically connecting an integrated circuit provided on a surface of a semiconductor wafer and a connecting terminal provided on a back surface of the semiconductor wafer, includes providing the semiconductor wafer having the integrated circuit provided on the surface of the semiconductor wafer and a hole provided in the semiconductor wafer along a thickness direction of the semiconductor wafer. At least a portion of a back surface of an electrode of the integrated circuit is exposed through the hole. A positive photosensitive resin composition is sprayed to form a coating film so that the coating film covers an inner surface of the hole. The positive photosensitive resin composition has a viscosity of 0.5 to 200 cP and includes an alkali-soluble resin, a compound which generates an acid when exposed to light, and a solvent. At least a portion of the coating film is exposed and developed to form a coating film pattern.

DESCRIPTION OF THE EMBODIMENTS

Figure 1A:
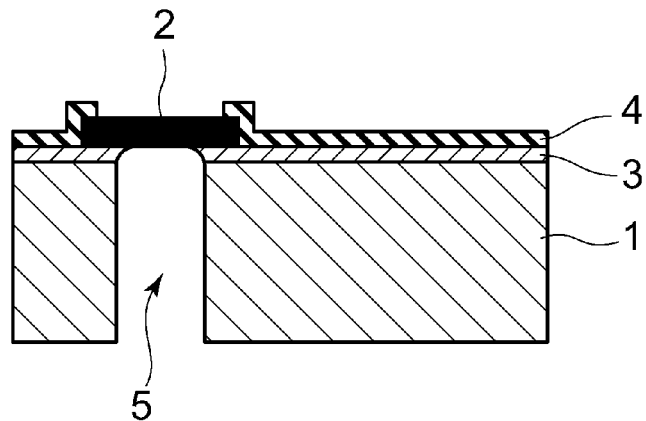
FIGS. 1A to 1C show a diagram for explaining steps in the method for producing the through electrode of the present invention.

In this specification, "the inner surface of a hole" includes not only the inner wall of the hole, but also the bottom portion of the hole. Further, "formed on a coating film pattern" includes not only forming on a coating film but also forming on an opening of the coating film. The same applies to "formed on an insulating film".

According to the embodiment of the present invention, a positive photosensitive resin composition for spray coating for forming a coating film on the inner surface of a hole provided in the thickness direction of a semiconductor wafer is provided. Further, according to the embodiment of the present invention, a method for producing a through electrode, which comprises forming a coating film pattern on the inner surface of a hole using the positive photosensitive resin composition, is provided.

According to a preferred embodiment of the present invention, by using the positive photosensitive resin composition of the present invention, it is possible to form a coating film having a uniform thickness on the inner surface of a very small-sized hole having a high aspect ratio formed in the thickness direction of a semiconductor wafer. Further, according to a preferred embodiment of the present invention, by using the positive photosensitive resin composition of the present invention, it is possible to form a fine pattern. Moreover, by using the obtained coating film pattern, it is possible to form an insulating film pattern in which only a desired region of the inside of a hole of a semiconductor wafer is exposed in a highly selective manner.

According to a preferred embodiment of the present invention, it is possible to suppress generation of leakage current in a through electrode and to improve a yield rate regarding formation of a through electrode in a semiconductor wafer.

Hereinafter, the positive photosensitive resin composition for spray coating and the method for producing a through electrode of the present invention will be described in detail.
1. Positive Photosensitive Resin Composition for Spray Coating Firstly, the positive photosensitive resin composition for spray coating of the present invention will be described.

The positive photosensitive resin composition for spray coating of the present invention is for forming a coating film on the inner surface of a hole provided in the thickness direction of a semiconductor wafer and comprises:
(A) an alkali-soluble resin;
(B) a compound which generates an acid when exposed to light; and
(C) a solvent,
wherein the viscosity is 0.5 to 200 cP.

(A) Alkali-Soluble Resin

The alkali-soluble resin to be used in the present invention is not particularly limited as long as it is a resin that can be solved in an alkaline developing solution, and examples thereof include a cresol-type novolac resin, a hydroxystyrene resin, a polyamide-based resin, an acrylic resin, and a cyclic olefin resin comprising a hydroxyl group and/or a carboxyl group. Among them, a polyamide-based resin is preferably used.

Examples of the polyamide-based resin include: a resin having at least one of a polybenzoxazole structure and a polyimide structure, wherein the main chain or side chain thereof has a hydroxyl group, a carboxyl group, an ether group, an ester group or a combination thereof; a resin having a polybenzoxazole precursor structure; a resin having a polyimide precursor structure; and a resin having a polyamic acid ester structure. In this regard, the "polybenzoxazole precursor structure" means a structure in which heating causes cyclization reaction to form a polybenzoxazole structure. Further, the "polyimide precursor structure" means a structure in which heating causes cyclization reaction to form a polyimide structure.

Preferred examples of the polyamide-based resin to be used in the present invention include those comprising a repeat unit represented by the following formula (1):

[Chemical Formula 1]

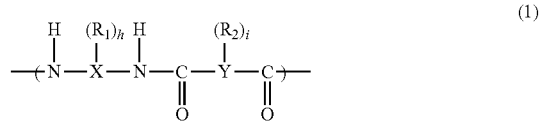

In the formula, X and Y are an organic group. Each of $R_1$s is a hydroxyl group, —O—$R_3$, an alkyl group, an acyloxy group or a cycloalkyl group, and these $R_1$s may be the same or different. Each of $R_2$s is a hydroxyl group, a carboxyl group, —O—$R_3$ or —COO—$R_3$, and these $R_2$s may be the same or different. h is an integer from 0 to 8, i is an integer from 0 to 8 and h+i=1 to 16. $R_3$ is an organic group having 1 to 15 carbon atoms. In this regard, when there are a plurality of $R_1$s and $R_2$s, they may be the same or different. When there is no hydroxyl group as $R_1$, at least one of $R_2$s is a carboxyl group. Further, when there is no carboxyl group as $R_2$, at least one of $R_1$ is a hydroxyl group.

In the polyamide-based resin represented by the aforementioned general formula (1), each of —O—$R_3$ as a substituent of X and —O—$R_3$ and —COO—$R_3$ as a substituent of Y may be a group in which a hydroxyl group and/or a carboxyl group are protected by $R_3$ that is an organic group having 1 to 15 carbon atoms for the purpose of adjusting the solubility of the hydroxyl group and the carboxyl group in an alkali aqueous solution. Examples of $R_3$s include a formyl group, a methyl group, an ethyl group, a propyl group, an isopropyl group, a t-butyl group, a t-butoxycarbonyl group, a phenyl group, a benzyl group, a tetrahydrofuranyl group and a tetrahydropyranyl group.

The polyamide-based resin comprising the structure represented by the general formula (1) can be obtained, for example, by reacting a compound selected from X-containing diamine, bis(aminophenol), 2,4-diaminophenol, etc. with a compound selected from Y-containing tetracarboxylic dianhydride, trimellitic anhydride, dicarboxylic acid or dicarboxylic dichloride, a dicarboxylic acid derivative, hydroxydicarboxylic acid, a hydroxydicarboxylic acid derivative, etc.

In the case of dicarboxylic acid, in order to improve a reaction yield, etc., an active ester-type dicarboxylic acid derivative in which 1-hydroxy-1,2,3-benzotriazole or the like is reacted in advance may be used.

Examples of X in the general formula (1) include aromatic compounds such as a benzene ring and a naphthalene ring, bisphenols, heterocyclic compounds such as pyrroles and furans, and siloxane compounds. More specifically, preferred examples thereof include substances represented by the following formulae (6-1) to (6-7). These substances may be used solely or in combination according to need.

[Chemical Formula 2]

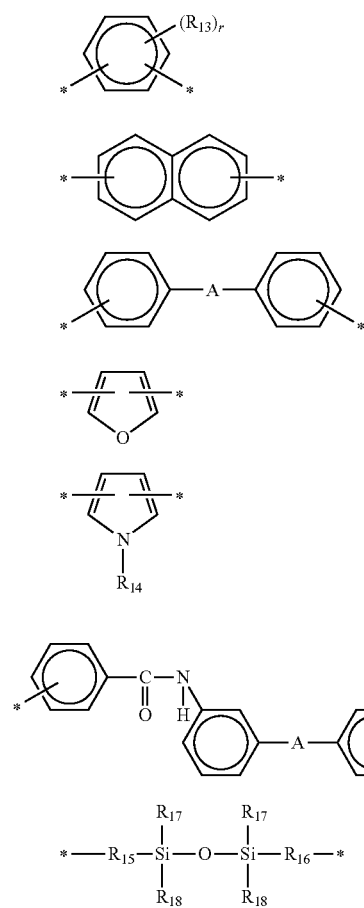

[Chemical Formula 3]

(7-1)

(7-2)

(7-3)

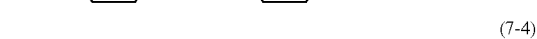
(7-4)

(7-5)

(7-6)

(7-7)

(7-8)

(7-9)

(7-10)

(7-11)

In the formulae, * shows that it binds to an NH group. A is —$CH_2$—, —$CH(CH_3)$—, —$C(CH_3)_2$—, —O—, —S—, —$SO_2$—, —CO—, —NHCO—, —$C(CF_3)_2$— or a single bond. $R_{13}$ is selected from the group consisting of an alkyl group, an alkyl ester group and a halogen atom, and when there are a plurality of $R_{13}$s, they may be the same or different. $R_{14}$ is an alkyl group, an alkoxy group, an acyloxy group or a cycloalkyl group. r is an integer from 0 to 4. $R_{15}$ to $R_{18}$ are an organic group.

Though omitted in the formulae above, as shown in the general formula (1), 0 to 8 $R_1$s are bound to X.

Among them, in terms of excellent heat resistance and mechanical properties, X is preferably a substance represented by any one of the following formulae (7-1) to (7-17).

(7-12)
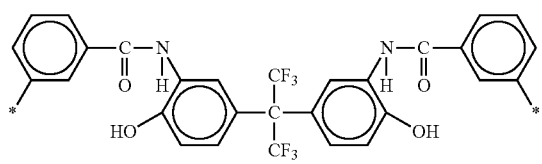

(7-13)
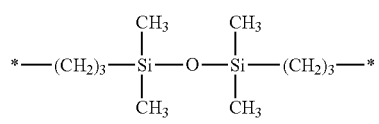

In the formulae, * shows that it binds to an NH group. D is —$CH_2$—, —$CH(CH_3)$—, —$C(CH_3)_2$—, —O—, —S—, —$SO_2$—, —CO—, —NHCO—, —$C(CF_3)_2$— or a single bond. E is —$CH_2$—, —$CH(CH_3)$— or —$C(CH_3)_2$—. $R_{12}$ is an alkyl group, an alkoxy group, an acyloxy group or a cycloalkyl group, and when there are a plurality of $R_{12}$s, they may be the same or different. $R_{19}$ is selected from the group consisting of an alkyl group, an alkyl ester group and a halogen atom, and when there are a plurality of $R_{19}$s, they may be the same or different. s is an integer from 1 to 3, and t is an integer from 0 to 4.

[Chemical Formula 4]

(7-14)
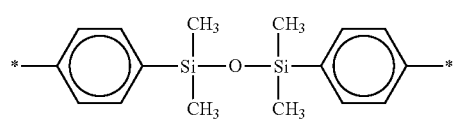

(7-15)
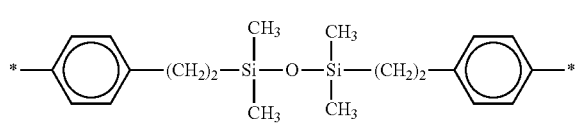

(7-16)
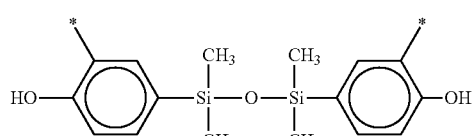

(7-17)
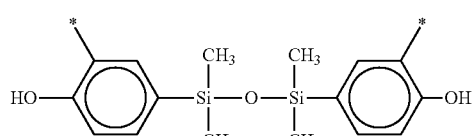

In the formulae, * shows that it binds to an NH group.

Among them, in terms of particularly excellent heat resistance and mechanical properties, X is preferably a substance represented by any one of the following formulae (3-1) to (3-6), and is particularly preferably a substance represented by any one of the following formulae (3-1), (3-3) and (3-4).

[Chemical Formula 5]

(3-1)
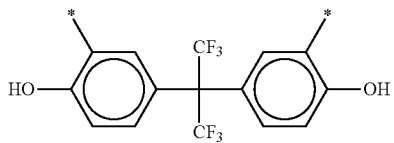

(3-2)
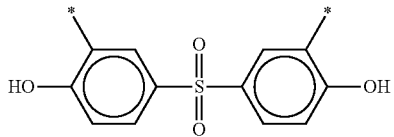

(3-3)
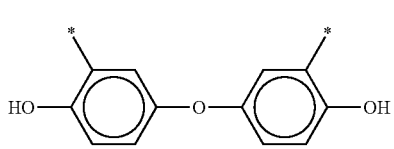

(3-4)
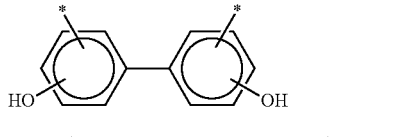

(3-5)
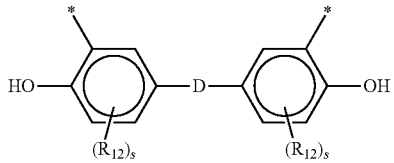

(3-6)
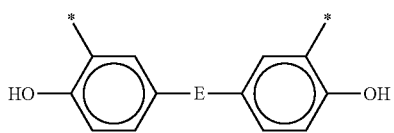

In the formulae, * shows that it binds to an NH group. D is —$CH_2$—, —$CH(CH_3)$—, —$C(CH_3)_2$—, —O—, —S—, —$SO_2$—, —CO—, —NHCO—, —$C(CF_3)_2$— or a single bond. E is —$CH_2$—, —$CH(CH_3)$— or —$C(CH_3)_2$—. $R_{12}$ is an alkyl group, an alkoxy group, an acyloxy group or a cycloalkyl group, and when there are a plurality of $R_{12}$s, they may be the same or different. s is an integer from 1 to 3.

Further, Y in the polyamide-based resin represented by the general formula (1) is an organic group, and examples thereof are the same as those for the aforementioned X and include aromatic compounds such as a benzene ring and a naphthalene ring, bisphenols, heterocyclic compounds such as pyrroles, pyridines and furans, and siloxane compounds. More specifically, preferred examples thereof include substances represented by the following formulae (8-1) to (8-8). These substances may be used solely or in combination.

[Chemical Formula 6]

(8-1)
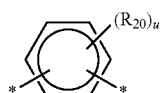

(8-2)

-continued

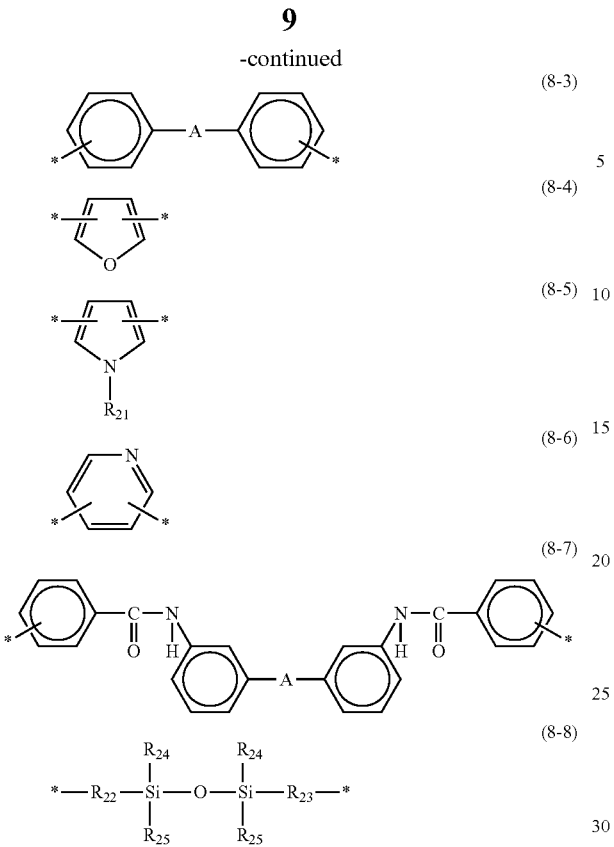

(8-3)
(8-4)
(8-5)
(8-6)
(8-7)
(8-8)

In the formulae, * shows that it binds to a C=O group. A is —CH$_2$—, —C(CH$_3$)$_2$—, —O—, —S—, —SO$_2$—, —CO—, —NHCO—, —C(CF$_3$)$_2$— or a single bond. Each of R$_{20}$s represents one selected from the group consisting of an alkyl group, an alkyl ester group and a halogen atom, and they may be the same or different. Further, R$_{21}$ represents one selected from the group consisting of a hydrogen atom, an alkyl group, an alkyl ester group and a halogen atom. u is an integer from 0 to 4. R$_{22}$ to R$_{25}$ are an organic group.

Though omitted in the formulae above, as shown in the general formula (1), 0 to 8 R$_2$s are bound to Y.

Among them, in terms of excellent heat resistance and mechanical properties, Y is preferably a substance represented by any one of the following formulae (9-1) to (9-21) and (10-1) to (10-4). Regarding the structures derived from tetracarboxylic dianhydride in the following formulae (9-1) to (9-21), those in which both positions that bind to a C=O group are a meta position and those in which both positions are a para position are exemplified, but such structures may include both a meta position and a para position.

[Chemical Formula 7]

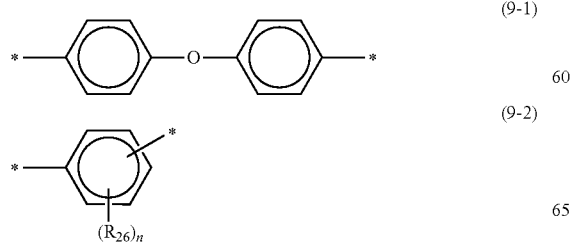

(9-1)
(9-2)

-continued

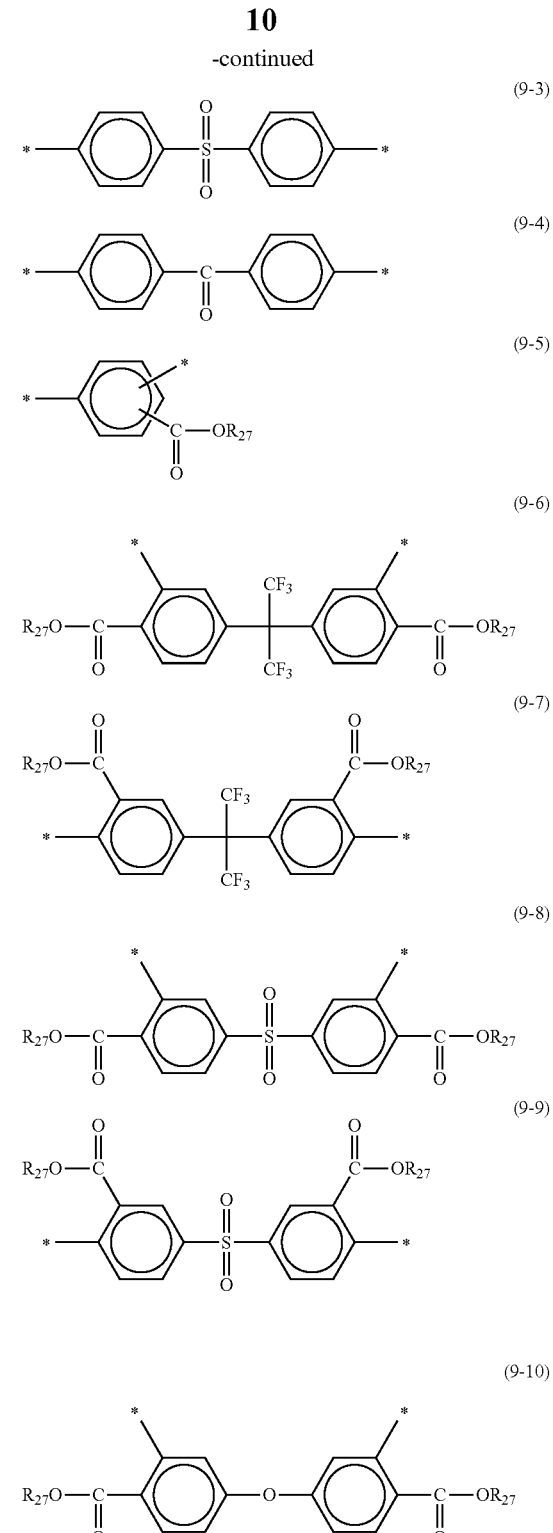

(9-3)
(9-4)
(9-5)
(9-6)
(9-7)
(9-8)
(9-9)
(9-10)

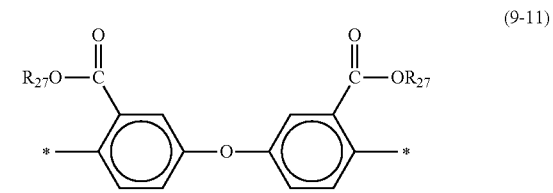

(9-11)

-continued (9-12)
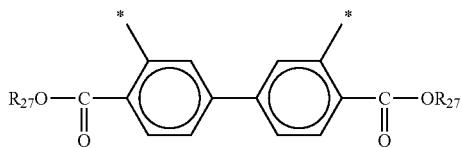

(9-13)
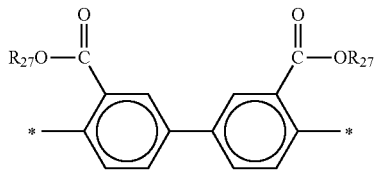

[Chemical Formula 8]

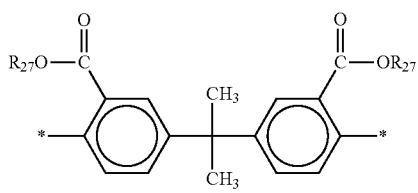

(9-15)

(9-17)
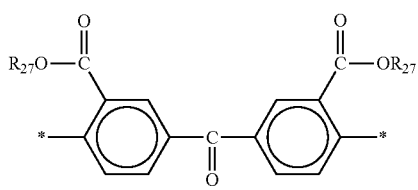

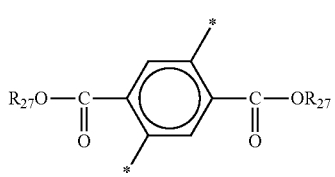

-continued (9-14)
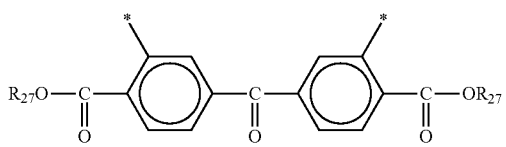

In the formulae, * shows that it binds to a C=O group. $R_{26}$ represents one selected from the group consisting of an alkyl group, an alkyl ester group, an alkyl ether group, a benzyl ether group and a halogen atom, and when there are a plurality of $R_{26}$s, they may be the same or different. Further, each of $R_{27}$s represents one selected from a hydrogen atom and an organic group having 1 to 15 carbon atoms, and a part of them may be substituted. n is an integer from 0 to 4.

(9-16)

(9-18)
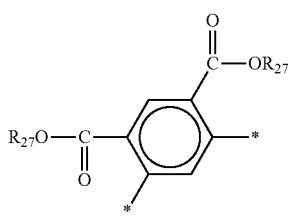

(9-19)

(9-20)
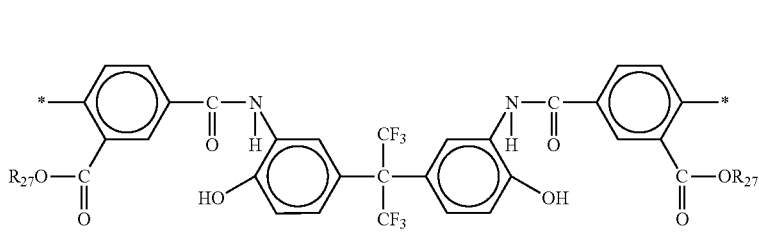

(9-21)
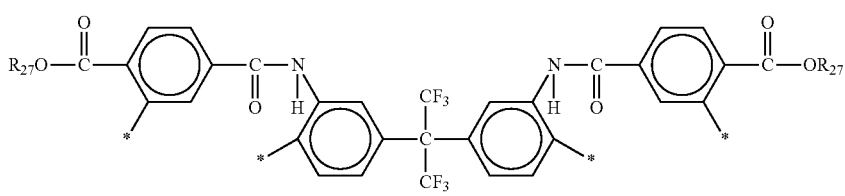

In the formulae, * shows that it binds to a C=O group. Each of $R_{27}$s represents one selected from a hydrogen atom and an organic group having 1 to 15 carbon atoms, and a part of them may be substituted.

[Chemical Formula 9]

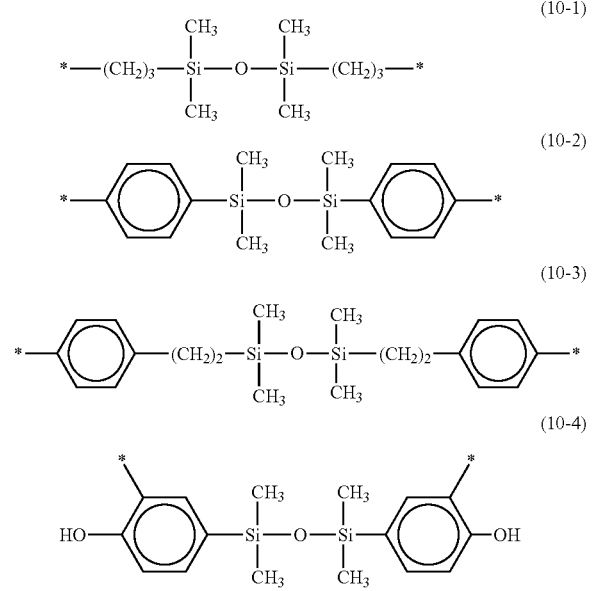

In the formulae, * shows that it binds to a C=O group.

Among them, in terms of particularly excellent heat resistance and mechanical properties, Y is preferably a substance represented by any one of the following formulae (11-1) to (11-4), and is particularly preferably a substance represented by any one of the following formulae (11-1) and (11-2).

[Chemical Formula 10]

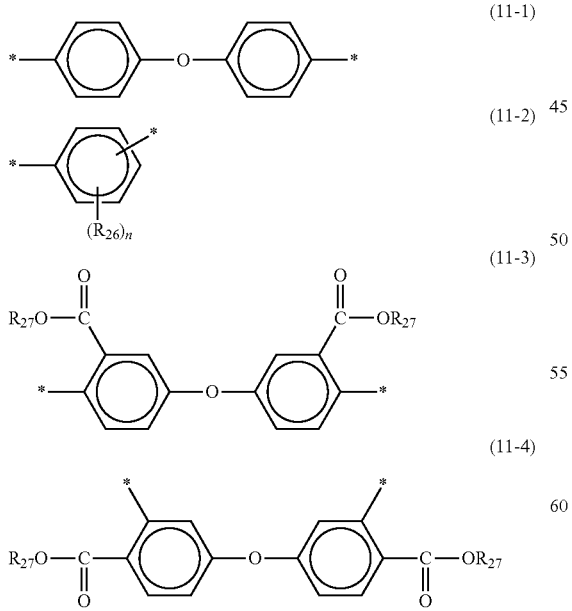

In the formulae, * shows that it binds to a C=O group. $R_{26}$ represents one selected from the group consisting of an alkyl group, an alkyl ester group, an alkyl ether group, a benzyl ether group and a halogen atom, and when there are a plurality of $R_{26}$s, they may be the same or different. Further, each of $R_{27}$s represents one selected from a hydrogen atom and an organic group having 1 to 15 carbon atoms, and a part of them may be substituted. n is an integer from 0 to 4.

Regarding the polyamide-based resin having a repeat unit represented by the above-described general formula (1), it is preferred that a terminus of the polyamide-based resin is an amino group and that the amino group is capped as an amide using an acid anhydride containing an aliphatic group or cyclic compound group having at least one alkenyl group or alkynyl group. The preservability can be improved thereby. Examples of groups caused by such an acid anhydride containing an aliphatic group or cyclic compound group having at least one alkenyl group or alkynyl group after reacted with an amino group include groups represented by the following formulae. These groups may be used solely or in combination.

[Chemical Formula 11]

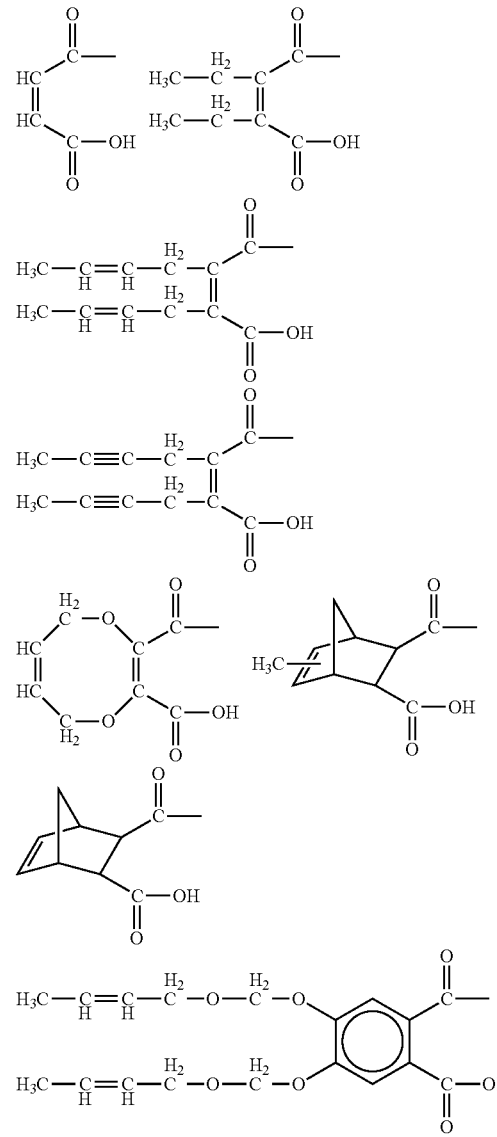

[Chemical Formula 12]

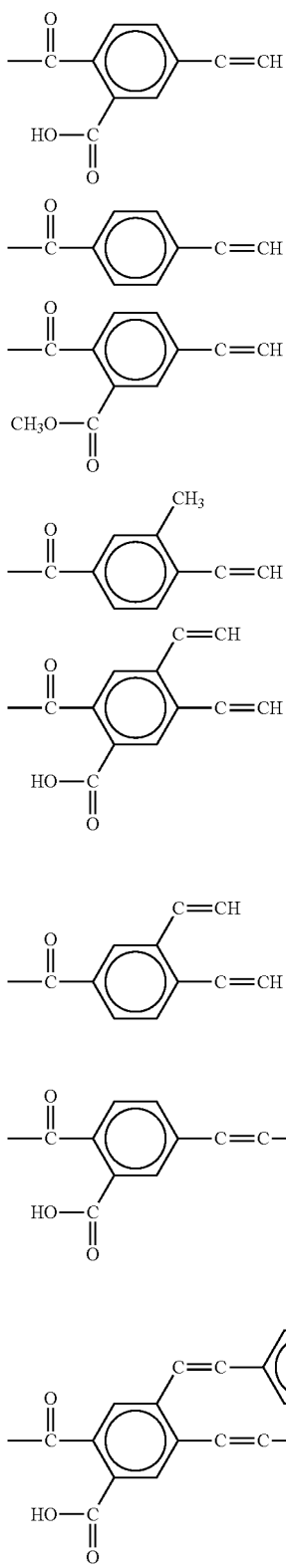

[Chemical Formula 13]

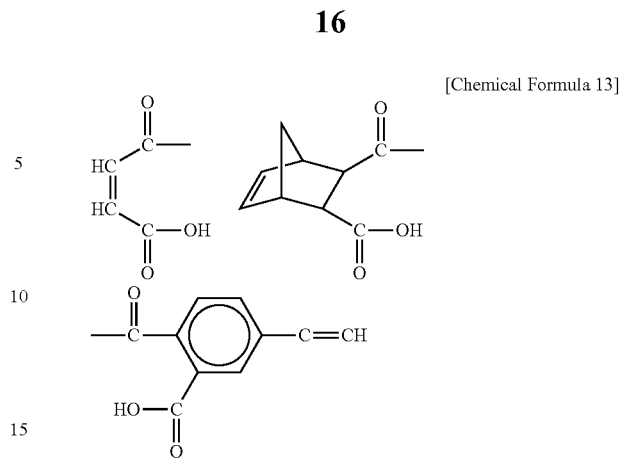

Further, the method is not limited to the above-described one. It is also possible to cap an acid at a terminus contained in the polyamide-based resin as an amide using an amine derivative containing an aliphatic group or cyclic compound group having at least one alkenyl group or alkynyl group.

The aforementioned polyamide-based resin may have a nitrogen-containing cyclic compound at least one of the side chain and the other terminus of the polyamide-based resin. Adhesion to metal wiring (particularly copper wiring), etc. can be improved thereby. When one of the terminuses of the polyamide-based resin is an organic group having an unsaturated group, because of reaction of the resin, mechanical properties such as a tensile elongation rate of a cured film are excellent. When having a nitrogen-containing cyclic compound at at least one of the side chain and the other terminus, since the nitrogen-containing cyclic compound reacts with metal wiring of copper and copper alloy, adhesion is excellent.

Examples of the nitrogen-containing cyclic compound include a 1-(5-1H-triazoyl)methyl-amino group, a 3-(1H-pyrazoyl)amino group, a 4-(1H-pyrazoyl)amino group, 5-(1H-pyrazoyl)amino group, a 1-(3-1H-pyrazoyl)methyl-amino group, 1-(4-1H-pyrazoyl) methyl-amino group, a 1-(5-1H-pyrazoyl)methyl-amino group, a (1H-tetrazol-5-yl) amino group, a 1-(1H-tetrazol-5-yl)methyl-amino group, and a 3-(1H-tetrazol-5-yl)benz-amino group. Among them, any one of the compounds represented by the following formulae is preferably used. Adhesion to metal wiring of copper and copper alloy can be particularly improved thereby.

[Chemical Formula 14]

The weight average molecular weight of the alkali-soluble resin of the present invention is preferably 1,000 to 100,000, more preferably 4,000 to 50,000, and even more preferably 10,000 to 35,000. When the weight average molecular weight is more than 100,000, development properties may be reduced. When the weight average molecular weight is less than 1,000, excessive dissolution may cause difficulty in patterning.

In the positive photosensitive resin composition for spray coating of the present invention, the content of the alkali- Among them, since the preservability of the polyamide-based resin can be particularly improved, any one of the groups represented by the following formulae is preferably used.

soluble resin is preferably 0.1 wt % or more, more preferably 0.5 wt % or more, and even more preferably 1 wt % or more of the entire composition. Further, it is preferably 50 wt % or less, more preferably 35 wt % or less, and even more preferably 25 wt % or less. When the content is within this range, it is possible to form a coating film having a sufficient thickness on the inner surface of a hole of a semiconductor wafer. On the other hand, when the content of the alkali-soluble resin is too much, coating properties and thickness uniformity are reduced, and when the content is too little, it is not preferable because a coating film having a sufficient thickness cannot be formed.

(B) Compound which Generates an Acid when Exposed to Light

When the positive photosensitive composition for spray coating of the present invention comprises a compound which generates an acid when exposed to light, it is possible to carry out pattern formation in which the solubility of an exposed portion with respect to a developing solution is changed from the solubility of a non-exposed portion by using a reaction in which an acid generated by exposure is used as a catalyst.

The compound which generates an acid when exposed to light to be used in the present invention preferably has an absorption spectrum region at 150 to 750 nm, and more preferably has an absorption spectrum region at 200 to 500 nm.

Examples of the compound which generates an acid when exposed to light include an onium salt, a halogenated organic compound, a quinone diazide compound, an $\alpha,\alpha$-bis(sulfonyl)diazomethane-based compound, an $\alpha$-carbonyl-$\alpha$-sulfonyl-diazomethane-based compound, a sulfone compound, an organic acid ester compound, an organic acid amide compound and an organic acid imide compound.

Specific examples of the onium salt include a diazonium salt, an ammonium salt, an iodonium salt, a sulfonium salt, a phosphonium salt, an arsonium salt, an oxonium salt, etc., each of which has an unsubstituted or symmetrically- or asymmetrically-substituted alkyl group, alkenyl group, aralkyl group, aromatic group or heterocyclic group.

Specific examples of counter anions of these onium salts are not particularly limited as long as they are compounds which can form a counter anion, and include boron acid, arsenic acid, phosphoric acid, antimonic acid, sulfonic acid, carboxylic acid and halogenated products thereof.

The halogenated organic compound is not particularly limited as long as it is a halogenated product of an organic compound, and various publicly-known compounds can be used. Specific examples thereof include various compounds such as halogen-containing oxadiazole-based compounds, halogen-containing triazine-based compounds, halogen-containing acetophenone-based compounds, halogen-containing benzophenone-based compounds, halogen-containing sulfoxide-based compounds, halogen-containing sulfone-based compounds, halogen-containing thiazole-based compounds, halogen-containing oxazol-based compounds, halogen-containing triazole-based compounds, halogen-containing 2-pyron-based compounds, halogen-containing aliphatic hydrocarbon compounds, halogen-containing aromatic hydrocarbon compounds, other halogen-containing heterocyclic compounds and sulfenyl halide-based compounds.

In addition, examples of the halogenated organic compound also include halogen-containing flame retardants such as tris(2,3-dibromopropyl)phosphate, tris(2,3-dibromo-3-chloropropyl)phosphate, chlorotetrabromoethane, hexachlorobenzene, hexabromobenzene, hexabromocyclododecane, hexabromobiphenyl, tribromophenyl allyl ether, tetrachlorobisphenol-A, tetrabromobisphenol-A, bis(bromo ethyl ether)tetrabromobisphenol-A, bis(chloro ethyl ether)tetrachlorobisphenol-A, tris(2,3-dibromopropyl)isocyanurate, 2,2-bis(4-hydroxy-3,5-dibromophenyl)propane and 2,2-bis(4-hydroxyethoxy-3,5-dibromophenyl)propane, and organochloro pesticides such as dichlorodiphenyltrichloroethane, benzenehexachloride, pentachlorophenol, 2,4,6-trichlorophenyl-4-nitrophenyl ether, 2,4-dichlorophenyl-3'-methoxy-4'-nitrophenyl ether, 2,4-dichlorophenoxyacetic acid, 4,5,6,7-tetrachlorophthalide, 1,1-bis(4-chlorophenyl)ethanol, 1,1-bis(4-chlorophenyl)-2,2,2-trichloroethanol, ethyl-4,4-dichlorobenzylate, 2,4,5,4'-tetrachlorodiphenyl sulfide and 2,4,5,4'-tetrachlorodiphenyl sulfone.

Specific examples of the quinone diazide compound include o-quinone azide compounds such as 1,2-benzoquinonediazide-4-sulfonic acid ester, 1,2-naphthoquinonediazide-4-sulfonic acid ester, 1,2-naphthoquinonediazide-5-sulfonic acid ester, 1,2-naphthoquinonediazide-6-sulfonic acid ester, 2,1-naphthoquinonediazide-4-sulfonic acid ester, 2,1-naphthoquinonediazide-5-sulfonic acid ester, 2,1-naphthoquinonediazide-6-sulfonic acid ester, sulfonic acid esters of other quinone diazide derivatives, 1,2-benzoquinonediazide-4-sulfonic acid chloride, 1,2-naphthoquinonediazide-4-sulfonic acid chloride, 1,2-naphthoquinonediazide-5-sulfonic acid chloride, 1,2-naphthoquinonediazide-6-sulfonic acid chloride, 2,1-naphthoquinonediazide-4-sulfonic acid chloride, 2,1-naphthoquinonediazide-5-sulfonic acid chloride, 2,1-naphthoquinonediazide-6-sulfonic acid chloride, and sulfonic acid chlorides of other quinone diazide derivatives.

Specific examples of the $\alpha,\alpha$-bis(sulfonyl)diazomethane-based compound include $\alpha,\alpha$-bis(sulfonyl)diazomethane having an unsubstituted or symmetrically- or asymmetrically-substituted alkyl group, alkenyl group, aralkyl group, aromatic group or heterocyclic group. Specific examples of the $\alpha$-carbonyl-$\alpha$-sulfonyl-diazomethane-based compound include $\alpha$-carbonyl-$\alpha$-sulfonyl-diazomethane having an unsubstituted or symmetrically- or asymmetrically-substituted alkyl group, alkenyl group, aralkyl group, aromatic group or heterocyclic group. Specific examples of the sulfone compound include sulfone compounds and disulfone compounds, each of which has an unsubstituted or symmetrically- or asymmetrically-substituted alkyl group, alkenyl group, aralkyl group, aromatic group or heterocyclic group. Specific examples of organic acid ester include carboxylic acid esters and sulfonic acid esters, each of which has an unsubstituted or symmetrically- or asymmetrically-substituted alkyl group, alkenyl group, aralkyl group, aromatic group or heterocyclic group. Specific examples of organic acid amide include carboxylic acid amides and sulfonic acid amides, each of which has an unsubstituted or symmetrically- or asymmetrically-substituted alkyl group, alkenyl group, aralkyl group, aromatic group or heterocyclic group. Specific examples of organic acid imide include carboxylic acid imides and sulfonic acid imides, each of which has an unsubstituted or symmetrically- or asymmetrically-substituted alkyl group, alkenyl group, aralkyl group, aromatic group or heterocyclic group. These compounds, which can generate an acid by cleavage caused by irradiation of active light, can be used solely or in combination.

Regarding the compound which generates an acid when exposed to light (B) to be used in the present invention, particularly preferred is an ester compound obtained by reacting a phenol compound with 1,2-naphthoquinone-2-diazide-5-sulfonic acid and/or 1,2-naphthoquinone-2-diazide-4-sulfonic acid. Examples thereof include, but are not limited to, compounds represented by the following formulae. Further, these compounds can be used solely or in combination.

Note that Q in the following formulae is any one of a hydrogen atom, a group represented by formula (2) and a group represented by formula (3). In this regard, at least one of Qs in each compound is a group represented by formula (2) or (3). When a plurality of Qs are included, they may be the same or different.

[Chemical Formula 15]
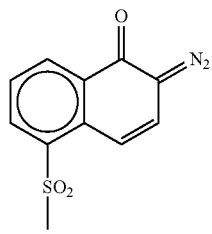
(2)
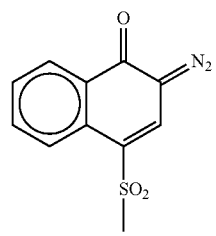
(2)
[Chemical Formula 16]
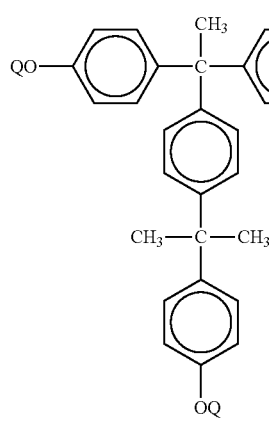
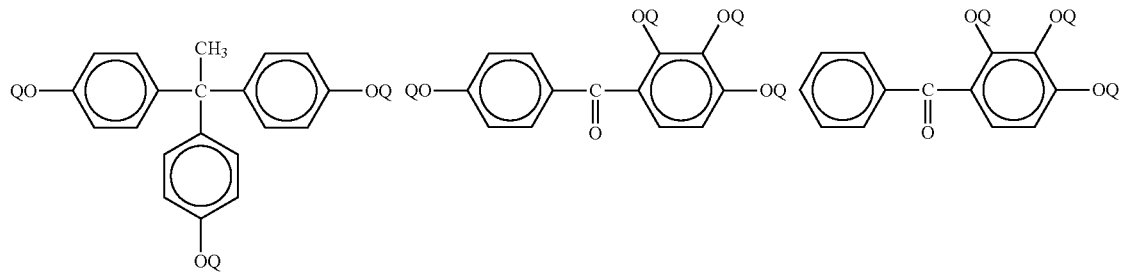
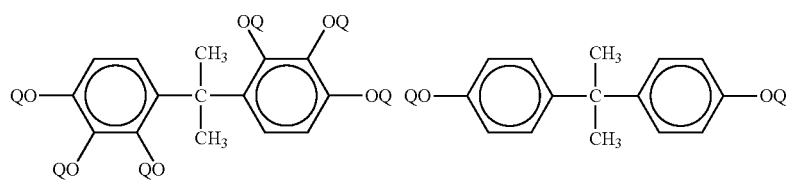
[Chemical Formula 17]
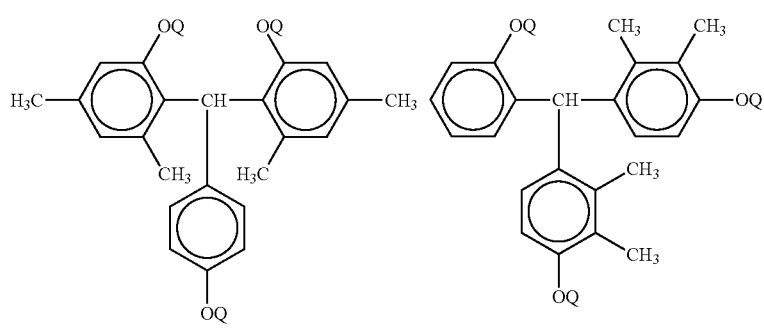

-continued
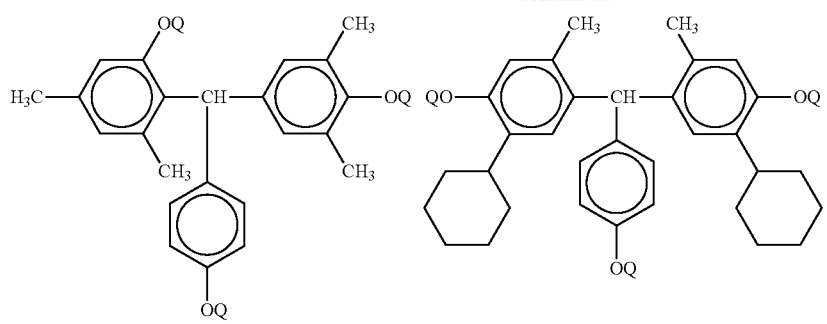
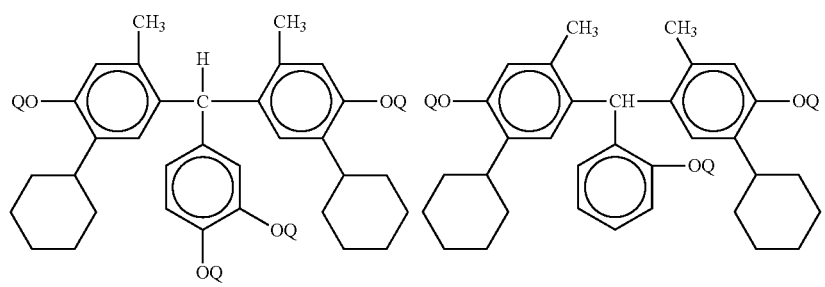
[Chemical Formula 18]
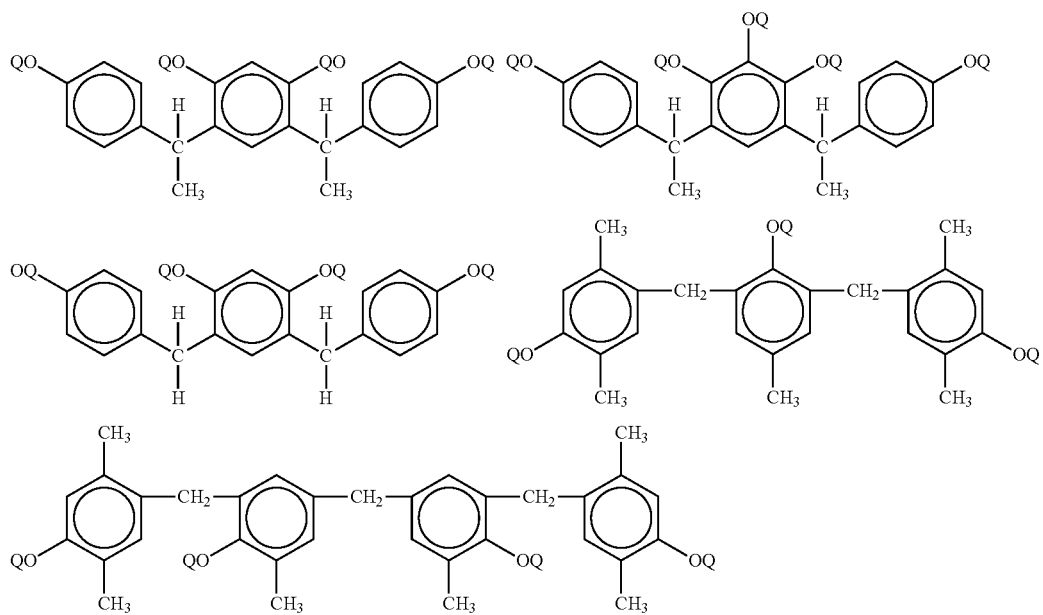
[Chemical Formula 18]
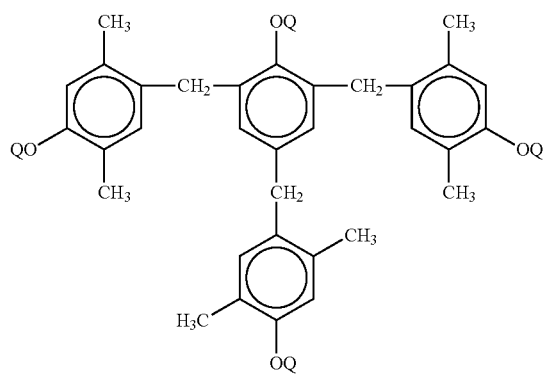

-continued
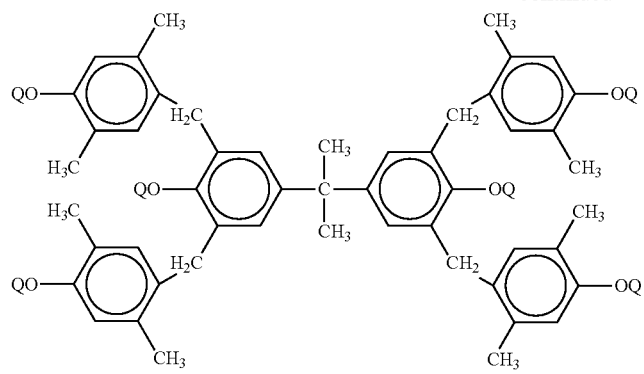
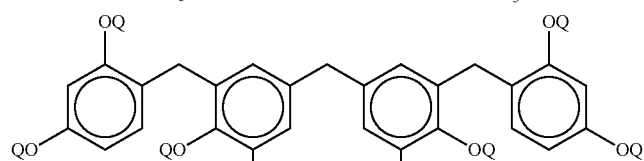
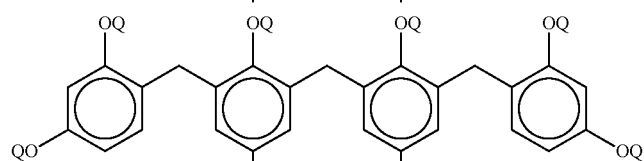
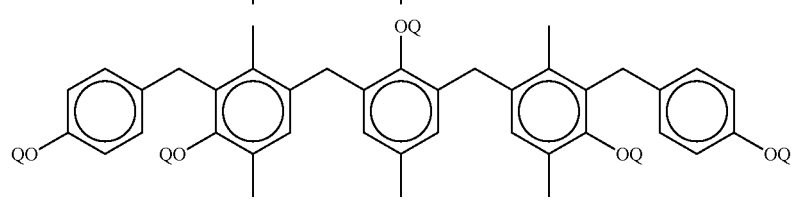
[Chemical Formula 20]
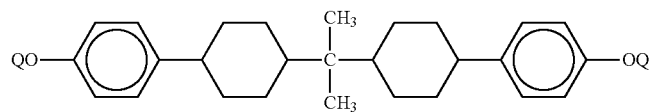
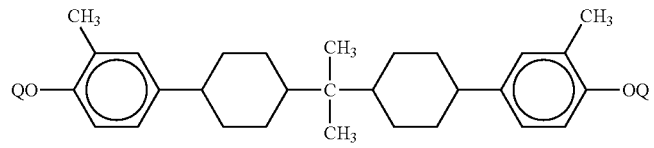
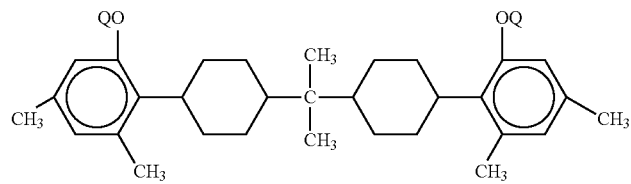
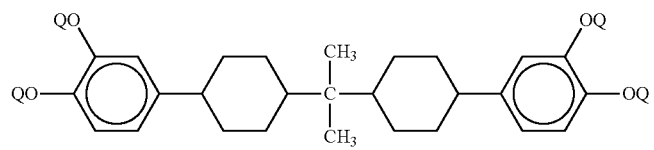
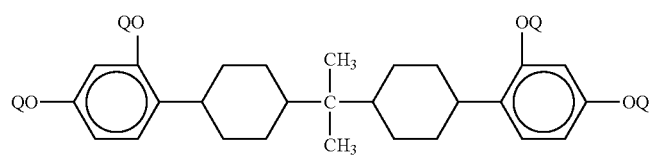

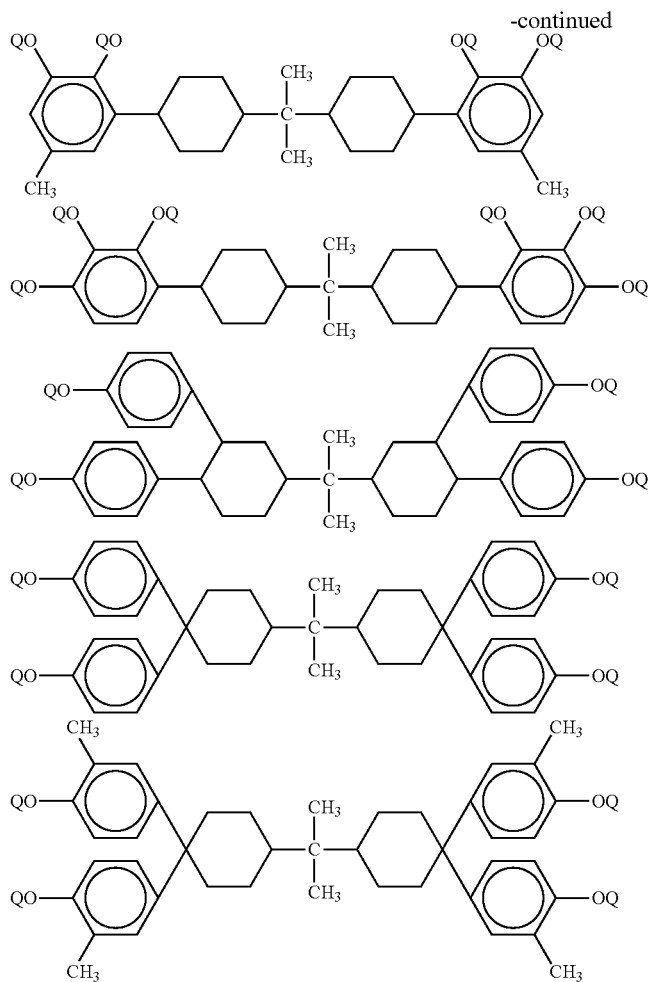

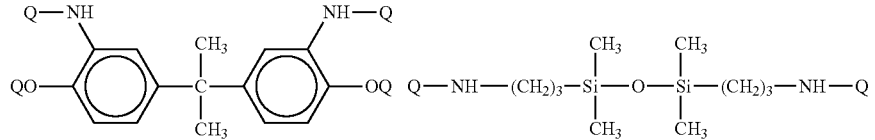

[Chemical Formula 21]

In the positive photosensitive resin composition for spray coating of the present invention, the content of the compound which generates an acid when exposed to light (B) is preferably 1 wt % or more, and more preferably 10 wt % or more of the content of the alkali-soluble resin (A). Further, it is preferably 50 wt % or less, and more preferably 40 wt % or less. When the content of the compound which generates an acid when exposed to light (B) is 1 wt % or more of the content of the alkali-soluble resin (A), a non-exposed portion is resistant to an alkali aqueous solution, and therefore, good patterning properties are obtained, a high film-remaining ratio and high resolution are retained, and sensitivity is improved. When the content is 50 wt % or less, high sensitivity and high resolution are retained because not only a scum but also reduction of transparency of a film caused by a photosensitizing agent itself is suitably suppressed, and a high film-remaining ratio is obtained even after curing, because reduction of a film thickness caused by decomposition of a components at the time of curing is suppressed.

(C) Solvent

The solvent to be used in the present invention is not particularly limited as long as it can dissolve the alkali-soluble resin (A) and the compound which generates an acid when exposed to light (B) and is inactive to these components.

Examples of the solvent to be used in the present invention include γ-butyrolactone, N-methyl-2-pyrrolidone, N,N-dimethylacetamide, N,N-dimethylformamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate, amyl acetate, t-butyl acetate, ethyl propionate, 2-methyltetrahydrofuran, ethyl acetate, isobutyl acetate, s-butyl acetate, n-butyl acetate, propyl acetate, isopropyl acetate, methyl propionate, 3-methyl-tetrahydrofuran, 2,5-dimethyl-tetrahydrofuran, lactic amide, methoxycyclopentanone, propyl lactate, isoamyl lactate, isoamyl acetate, butyl propionate, ethylene glycol monomethyl ether acetate, ethylene glycol monopropyl ether, 2-ethoxyethyl acetate, and 2-ethylbutyl acetate. These substances can be used solely or in combination.

In a preferred embodiment of the present invention, the solvent (C) comprises a first solvent having a boiling point of 140° C. or higher and a second solvent having a boiling point of lower than 140° C. In a more preferred embodiment of the present invention, the solvent (C) comprises a first solvent having a boiling point of 140° C. or higher and a second solvent having a boiling point of 120° C. or lower. By using the first solvent having a boiling point of 140° C. or higher, it becomes possible to suppress generation of pinhole defect of a coating film and to form a coating film having a uniform thickness. Further, by using the second solvent having a boiling point of lower than 140° C., at the time of applying the positive photosensitive resin composition of the present invention to the inner surface of a hole provided in the vertical direction such as a through hole of a semiconductor wafer, dripping to the lower portion of the through hole can be prevented, thereby enabling formation of a coating film having a uniform thickness.

The boiling point of the first solvent to be used in the present invention is preferably 140° C. or higher, more preferably 145° C. or higher, and even more preferably 150° C. or higher. Further, the boiling point of the first solvent is preferably 210° C. or lower, more preferably 205° C. or lower, and even more preferably 200° C. or lower.

The first solvent preferably dissolves the alkali-soluble resin. Examples thereof include γ-butyrolactone, amyl acetate, methyl lactate, ethyl lactate, butyl lactate, propyl lactate, isoamyl lactate, isoamyl acetate, butyl propionate, and ethylene glycol monomethyl ether acetate. These substances can be used solely or in combination.

The boiling point of the second solvent to be used in the present invention is preferably lower than 140° C., more preferably 120° C. or lower, even more preferably 100° C. or lower, and particularly preferably 90° C. or lower. Further, the boiling point of the second solvent is preferably 50° C. or higher, more preferably 60° C. or higher, and even more preferably 70° C. or higher.

The second solvent preferably improves volatility of the positive photosensitive resin composition. Preferred examples thereof include linear or cyclic carboxylic acid ester-based solvents or ether-based solvents such as ethyl acetate, 2-methyl-tetrahydrofuran, ethyl propionate, t-butyl acetate, propylene glycol monomethyl ether, isobutyl acetate, s-butyl acetate, n-butyl acetate, propyl acetate, isopropyl acetate, methyl propionate, 3-methyl-tetrahydrofuran and 2,5-dimethyl-tetrahydrofuran. In particular, when the vapor pressure at 20° C. is 25 kPa or more, increase of the viscosity of the resin composition due to volatilization of the solvent is significant at the time of storage at ordinary temperature, and therefore, in order to achieve a balance between volatility at the time of coating and viscosity stability at the time of storage at ordinary temperature, it is preferred to use t-butyl acetate, ethyl propionate, ethyl acetate or the like which is a solvent having a vapor pressure of 25 kPa or less. These solvents can be used solely or in combination.

When the first solvent and the second solvent are used in combination, the content of the first solvent is preferably 5 wt % or more, more preferably 15 wt % or more, and even more preferably 20 wt % or more of the entire solvent (C). Further, the content of the first solvent is preferably 50 wt % or less, more preferably 40 wt % or less, and even more preferably 35 wt % or less.

The content of the second solvent is preferably 50 wt % or more, more preferably 60 wt % or more, and even more preferably 65 wt % or more of the entire solvent (C). Further, the content of the second solvent is preferably 95 wt % or less, more preferably 85 wt % or less, and even more preferably 80 wt % or less.

Regarding the combination ratio between the first solvent and the second solvent, the first solvent:the second solvent is preferably 5:95 to 50:50, and more preferably 15:85 to 40:60.

By using both the first solvent and the second solvent whose boiling points are different from each other, and by adjusting the viscosity of the positive photosensitive resin composition within a specific range, it becomes possible to provide a remarkable ability to form a coating film on the inner surface of a hole having a high aspect ratio provided in the thickness direction of a semiconductor wafer, and it becomes possible to form a coating film having a more uniform thickness on the inner surface of the hole.

The use amount of the solvent is not particularly limited as long as the solvent can dissolve the alkali-soluble resin, the compound which generates an acid when exposed to light and optional components and the use amount is within the range in which the composition of the present invention can have a desired viscosity. Usually, the suitable use amount of the solvent is 30 to 98 wt % of the entire composition.

(D) Optional Components

The positive photosensitive resin composition for spray coating of the present invention may include optional components in addition to the above-described components (A) to (C) without departing from the purpose of the present invention.

For example, in order to improve coating properties at the time of spray coating, a surfactant may be included. Examples of the surfactant include a fluorine-based surfactant, a siloxane-based surfactant and a non-fluorine-based surfactant.

Examples of the fluorine-based surfactant include those with a structure having a perfluoroalkyl group, and specific examples thereof include, but are not limited to, Megafac F-470, F-471, F-472SF, F-474, F-475, R-30, F-477, F-478, F-479, BL-20, R-61 and R-90 manufactured by Dainippon Ink and Chemicals Inc., and FC-170C and FC-4430 manufactured by 3M.

Examples of the siloxane-based surfactant include, but are not limited to, a polyalkyl-modified siloxane-based surfactant, a polyester-modified siloxane-based surfactant, an aralkyl-modified siloxane-based surfactant and an alkylaralkyl-modified siloxane-based surfactant.

Examples of the non-fluorine-based surfactant include, but are not limited to, a nonion-based surfactant such as polyoxyethylene lauryl ether, polyoxyethylene oleyl ether, polyoxyethylene octyl phenyl ether, polyoxyethylene nonyl phenyl ether, polyethylene glycol dilaurylate and polyethylene glycol distearate, and a surfactant consisting of an acrylic polymer or a methacrylic polymer.

These surfactants may be used solely or in combination. The content of the surfactant is not particularly limited if it is within a range without departing from the purpose of the present invention.

Further, an additive such as a silane coupling agent may be included according to need. Examples of the silane coupling agent include an epoxysilane coupling agent and an aromatic-containing aminosilane coupling agent. These substances may be used solely or in combination. The content of the silane coupling agent is not particularly limited, but is preferably 0.05 to 50 wt %, and more preferably 0.1 to 20 wt % of the entire composition.

The viscosity of the positive photosensitive resin composition for spray coating of the present invention is 0.5 to 200 cP. When the viscosity of the composition is within this range, liquid leakage from a nozzle center is suppressed, and it is possible to form a coating film having a uniform thickness without generation of pinhole defect in the inner surface of a hole having a high aspect ratio with a very small size in a semiconductor wafer. The viscosity is more preferably 1 cP or more, even more preferably 5 cP or more, and particularly preferably 10 cP or more. Further, the viscosity is more preferably 100 cP or less, even more preferably 50 cP or less, and particularly preferably 30 cP or less.

Further, regarding the positive photosensitive resin composition for spray coating of the present invention, the dynamic viscosity ratio A ($\eta 0.1/\eta 100$) between a dynamic viscosity of $\eta 0.1$ at a shear rate of 0.1/s and a dynamic viscosity of $\eta 100$ at a shear rate of 100/s is preferably 1.5 to 400. When the dynamic viscosity ratio A of the composition is within this range, the composition is relatively in a state with a high viscosity when in a static state, and therefore, dripping at a vertical wall surface of a hole of a semiconductor wafer does not easily occur, and an excellent uniform film thickness is obtained. The dynamic viscosity ratio A is more preferably 3 to 300, even more preferably 5 to 200, and particularly preferably 10 to 140.

In addition, regarding the positive photosensitive resin composition for spray coating of the present invention, the dynamic viscosity ratio B ($\eta 100/\eta 1000$) between a dynamic viscosity of $\eta 100$ at a shear rate of 100/s and a dynamic viscosity of $\eta 1000$ at a shear rate of 1000/s is preferably 0.6 to 5.0. When the dynamic viscosity ratio B of the composition is within this range, the composition is relatively in a state with a low viscosity when in a dynamic state, and therefore, good flowability is obtained when the composition passes through a nozzle or is subjected to spin coating. The dynamic viscosity ratio B is more preferably 0.8 to 4.5, even more preferably 1.0 to 4.0, and particularly preferably 1.2 to 3.5.

The means for obtaining shear rate dependence of the viscosity as described above is not particularly limited, and examples thereof include a technique of adding an inorganic filler such as silica, mica, zinc oxide, titanium oxide and calcium carbonate, an organic filler such as rubber particles, urethane particles and acrylic particles, or a rheology regulator such as a polyurethane-based, polyurea-based, polyacrylic acid-based, or polyamide-based rheology regulator. Among them, it is preferred to use silica or a rheology regulator, which contains only a small amount of impurities and which can realize the above-described shear rate dependence with a small additive amount.

When using the inorganic filler and the organic filler, the average particle diameter thereof is preferably 1 nm to 1000 nm, more preferably 5 nm to 800 nm, and even more preferably 10 nm to 500 nm. The average particle diameter can be measured using a laser diffraction type particle size distribution measuring device. The content of the inorganic filler and the organic filler is preferably 0.5 to 80 wt %, more preferably 1 to 50 wt %, and even more preferably 5 to 30 wt % of the total weight of the positive photosensitive resin composition. The content of the rheology regulator is preferably 0.1 to 30 wt %, more preferably 0.5 to 20 wt %, and even more preferably 1 to 10 wt % of the total weight of the positive photosensitive resin composition.

In the present invention, the viscosity of the positive photosensitive resin composition is defined as a viscosity after 5 minutes measured under the following measurement conditions: a measurement device: TVE-20L form viscosity meter cone plate type (TOKIMEC); a rotor used: a standard rotor (1° 34', R=2.4 cm); a rotation number: 10 rpm; and a temperature: 25° C.

Further, in the present invention, regarding the dynamic viscosity ratio of the positive photosensitive resin composition, dynamic viscosities at respective shear velocities ($\eta 0.1$, $\eta 100$, $\eta 1000$) are measured under the following measurement conditions: a measurement device: a viscoelasticity measurement device ARES-2KSTD (Reometric Scientific); a rotor used: a parallel plate type (R=4.0 cm); and a temperature: 25° C. The dynamic viscosity ratio can be obtained by the following formulae using the measured values:

Dynamic viscosity ratio $A = \eta 0.1/\eta 100$

Dynamic viscosity ratio $B = \eta 100/\eta 1000$

Moreover, for the purpose of forming a coating film having a uniform thickness on the inner surface of a hole formed in the thickness direction of a semiconductor wafer, the positive photosensitive resin composition of the present invention preferably has desired wet-spreading property with respect to the semiconductor wafer. In the present invention, the wet-spreading property is defined by the ratio (A/B) between the maximum value A of the dropping length in the vertical direction and the maximum value B of the spreading width in the horizontal direction of a coating film that is obtained by dropping one drop of the positive photosensitive resin composition (15 mg) on a silicon wafer in which a contact angle at the time of measurement using γ-butyrolactone is 89 to 97° and arranging and fixing the silicon wafer so as to stand with an angle of 80° to be left for 3 minutes. The wet-spreading property of the positive photosensitive resin composition of the present invention as defined above is preferably 0.1 to 20, and more preferably 0.5 to 10. With such a value, dripping at a vertical wall surface does not easily occur, and an excellent uniform film thickness is obtained.

2. Method for Producing a Through Electrode

Next, the method for producing a through electrode of the present invention will be described.

The method for producing a through electrode of the present invention is a method for producing a through electrode for electrically connecting an integrated circuit provided on the surface of a semiconductor wafer and a connecting terminal provided on the back surface of the semiconductor wafer, comprising:

a coating film forming step in which a coating film is formed by applying the positive photosensitive resin composition of the present invention by means of spray coating so as to cover the inner surface of a hole provided in the thickness direction of the semiconductor wafer so that at least a portion of the back surface of an electrode portion of the integrated circuit provided on the surface of the semiconductor wafer is exposed; and a pattern forming step in which at least a portion of the coating film formed on the back surface of the electrode portion is exposed and thereafter the exposed portion is developed, thereby forming a coating film pattern in which at least a portion of the back surface of the electrode portion is exposed.

The present invention relates to a method for forming a through electrode for electrically connecting an integrated circuit and a connecting terminal provided on the back surface of a semiconductor wafer after the integrated circuit is provided on the surface of the semiconductor wafer. One of the characteristics of the present invention is that, after a coating film is formed to cover the inner surface of a hole using the positive photosensitive resin composition for spray coating of the present invention, the coating film is subjected to exposure and development, thereby forming a coating film pattern in the inner portion of the hole provided in the thickness direction of the semiconductor wafer.

Hereinafter, the method for producing a through electrode of the present invention will be described with reference to the drawings.

Figure 1B:
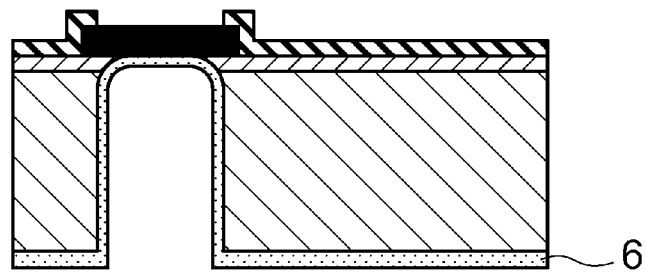
Figure 1C:
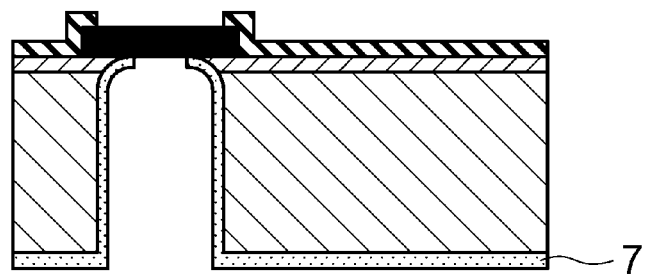

FIGS. 1A to 1C show a diagram for explaining steps in the method for producing the through electrode of the present invention.

FIG. 1A is an example of the structure of a semiconductor wafer. As shown in FIG. 1A, a metal wiring 3 of an integrated circuit is formed on the surface of a semiconductor wafer 1, and on the metal wiring 3, an electrode portion 2 of the integrated circuit and a solder resist layer 4 are formed. In the thickness direction of the semiconductor wafer 1, a hole 5, which has an opening in the back surface of the semiconductor wafer 1 and is formed so that at least a portion of the back surface of the electrode portion 2 is exposed, is provided. The ratio between the depth of the hole 5 and the diameter of the hole (L/D ratio:aspect ratio) is not particularly limited, but is preferably 1 to 10, and more preferably 2 to 5.

The method for forming a hole in a semiconductor wafer is not particularly limited, and publicly-known methods may be used. Among them, reactive ion etching (RIE), in which etching is performed with gas being ionized and radicalized by plasma, is preferred since it is suitable for formation of a hole having a very small size with a high aspect ratio.

Next, as shown in FIG. 1B, a coating film 6 is formed to cover the inner surface of the hole 5 by spray coating of the positive photosensitive resin composition of the present invention.

At the time of spray coating of the composition, for example, it is preferred to use dry nitrogen or the like as a gas for atomization and to apply a mist containing the composition to the inner surface of the hole. The particle diameter of the mist is preferably 10 μm or less. The gas pressure of the gas for atomization at the time of spray coating of the composition is not particularly limited, and is preferably 0.5 to 5.0 kg/cm$^2$. The supplied amount (sprayed amount) of the composition sprayed from a nozzle on the inner surface of the hole may be suitably adjusted, and the amount may be constant or may be changed.

The spray coating device is not particularly limited, and a resist coating device "NanoSpray" of Austria EV Group (EVG), a resist coating device "Delta Alta Spray" of SUSS Micro Tec or the like may be used. The nozzle diameter of such device is preferably about 0.1 to 2 mm.

After spray coating, the solvent in the coating film is removed by pre-baking. Pre-baking is usually performed by heating the semiconductor wafer put on a bake plate (hot plate) or heating the semiconductor wafer in a heating device such as a clean oven. The heating temperature is preferably 60° C. to 150° C., and more preferably 100° C. to 130° C.

The thickness of the coating film formed in this way (after pre-baking) is preferably 0.1 to 40 μm, and more preferably 1 to 20 μm.

Next, at least a portion of the coating film formed on the back surface of the electrode portion 2 is exposed, and the exposed portion is developed.

At the time of exposure of the coating film, a semiconductor wafer photomask is used, and only at least a portion on the back surface of the electrode portion 2 is exposed. The wavelength of light to be irradiated is preferably 150 nm to 750 nm, and more preferably 200 nm to 500 nm. The type of a light source is not particularly limited, and depending on a desired wavelength of light, an ultraviolet lamp, a mercury lamp, a xenon lamp, a deuterium lamp or the like may be suitably selected.

Next, the exposed portion is developed using a developing solution. The developing solution to be used in the present invention is not particularly limited as long as it is usually used for the development of a photoresist in the semiconductor process. For example, an aqueous solution of any of alkalis such as: inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; and quaternary ammonium salts such as tetramethylammonium hydroxide and tetraethylammonium hydroxide, and an aqueous solution in which, to the above-described aqueous solution, a water-soluble organic solvent such as alcohol (e.g., methanol and ethanol) and a surfactant are added in an appropriate amount, can be suitably used. As the method of development, a puddling method, a dipping method, a spray method, an ultrasonic method, etc. can be employed.

After the development of the exposed portion, washing is carried out using a rinse, and the coating film is cured by post-baking The rinse is not particularly limited, but distilled water is preferably used. Post-baking is performed by heating the coating film using a bake plate, a clean oven or the like. The heating temperature is not particularly limited, and is preferably 180° C. to 400° C., and more preferably 200° C. to 380° C. In this way, a coating film pattern 7 in which at least a portion of the back surface of the electrode portion 2 is exposed as shown in FIG. 1C can be formed.

According to a preferred embodiment of the present invention, by using the positive photosensitive resin composition of the present invention, a coating film having a uniform thickness can be formed even on the inner surface of a very small-sized hole having a high aspect ratio formed to pass through a semiconductor wafer. Further, according to a preferred embodiment of the present invention, by using the positive photosensitive resin composition of the present invention, it is possible to form a fine pattern. Therefore, a desired region of the inside of a hole of a semiconductor wafer can be exposed in a highly selective manner, and other regions can be protected with an insulating film. In this way, it is possible to suppress generation of leakage current in a through electrode and to improve a yield rate in a through electrode in a semiconductor wafer.

The coating film pattern formed in this way can be used as an insulating film for preventing leakage current in a through electrode, or can be used as a mask for forming a pattern of another insulating film. Hereinafter, a method for forming a through electrode using the coating film pattern formed according to the present invention as an insulating film (hereinafter referred to as "the first embodiment") and a method for forming a through electrode using the coating film pattern formed according to the present invention as a mask for pattern formation (hereinafter referred to as "the second embodiment") will be specifically described.

First Embodiment

In the first embodiment of the present invention, the coating film pattern formed as described above is used as an insulating film, and a metal film, which is for electrically connecting the back surface of an electrode portion and a connecting terminal provided on the back surface of the aforementioned semiconductor wafer, is formed on the coating film pattern, thereby forming a through electrode.

That is, the first embodiment of the present invention provides a method for producing a through electrode for electrically connecting an integrated circuit provided on the surface of a semiconductor wafer and a connecting terminal provided on the back surface of the semiconductor wafer, comprising:

a coating film forming step in which a coating film is formed by applying the positive photosensitive resin composition of the present invention by means of spray coating so as to cover the inner surface of a hole provided in the thickness direction of the semiconductor wafer so that at least a portion of the back surface of an electrode portion of the integrated circuit provided on the surface of the semiconductor wafer is exposed;

a pattern forming step in which at least a portion of the coating film formed on the back surface of the electrode portion is exposed and thereafter the exposed portion is developed, thereby forming a coating film pattern in which at least a portion of the back surface of the electrode portion is exposed; and a metal film forming step in which a metal film is formed on the coating film pattern formed in the pattern forming step in order to electrically connect the back surface of the electrode portion and the connecting terminal provided on the back surface of the semiconductor wafer.

Hereinafter, the first embodiment of the present invention will be described with reference to the drawings. FIGS. 2A to 2F show a diagram for explaining steps in the method for producing the through electrode according to the first embodiment of the present invention.

Figure 2A:
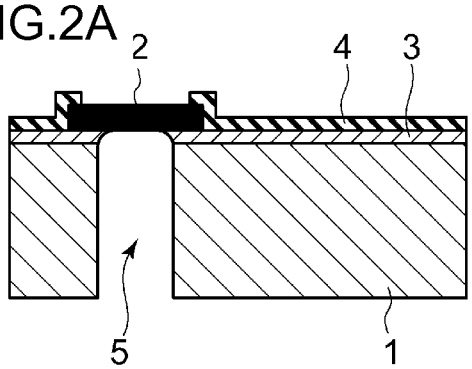
FIGS. 2A to 2F show a diagram for explaining steps in the method for producing the through electrode according to the first embodiment of the present invention.
Figure 2B:
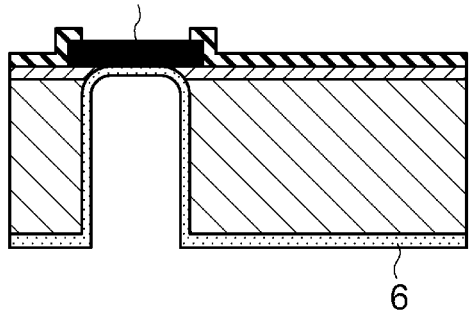

Firstly, a semiconductor wafer 1, in which a hole 5 is formed in the thickness direction of the semiconductor wafer 1 so that at least a portion of the back surface of an electrode portion 2 of an integrated circuit is exposed, is prepared (see FIG. 2A).

Figure 2C:
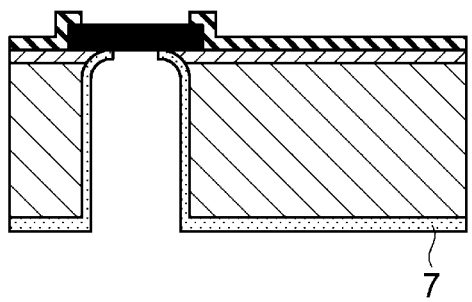

Next, a coating film 6 is formed by applying the positive photosensitive resin composition of the present invention by means of spray coating so as to cover the inner surface of the hole 5 of the semiconductor wafer 1 (see FIG. 2B), and by exposing and developing at least a portion of the back surface of the electrode portion 2, a coating film pattern 7, in which at least a portion of the back surface of electrode portion 2 is exposed, is formed (see FIG. 2C). The method for forming a coating film and the method for forming a coating film pattern are the same as those already described, and therefore explanation thereof is not repeated here. Letters or numerals in FIGS. 2A to 2F correspond to those in FIGS. 1A to 1C.

Figure 2D:
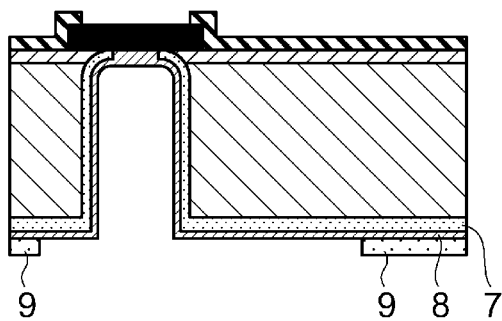

Next, as shown in FIG. 2D, a seed layer 8 is formed in order to form a metal film on the coating film pattern 7. The seed layer can be formed using a sputtering method or a metal CVD method. The metal to be used for the seed layer is not particularly limited, and is preferably TiW/NiV/Cu, Ni, Ni/Cu, TiN/Ti/Cu, etc. Regarding the case where a plurality of metals are used for the seed layer, explanation thereof is like "lower layer/upper layer" or "lower layer/middle layer/upper layer", starting from the layer closest to the coating film pattern and the back surface of the semiconductor wafer.

Next, on the seed layer 8, a photosensitive film pattern 9, which has an opening at an area for providing a metal film for electrically connecting the back surface of the electrode portion and the connecting terminal provided on the back surface of the semiconductor wafer, is formed.

The photosensitive film pattern 9 can be formed by forming a coating film using a positive or negative photosensitive resin composition usually used in the semiconductor process, thereafter performing exposure using a mask for pattern formation having an opening at a predetermined area and developing an exposed portion.

Figure 2E:
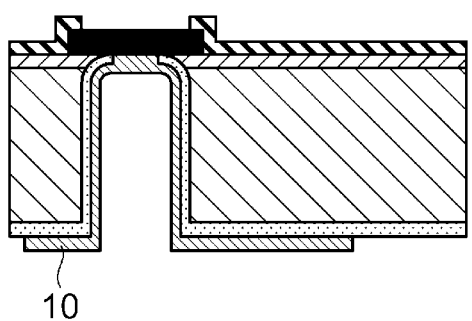

Next, utilizing the seed layer 8 exposed from the opening of the photosensitive film pattern 9 as a plated terminal, the electrolytic plating treatment is performed to form a metal film 10. After that, the photosensitive film pattern 9 is removed and an exposed portion of the seed layer is etched. In this way, the metal film 10 as shown in FIG. 2E can be formed. The electrolytic plating treatment can be performed using conditions usually used in the semiconductor process. As the metal film, a single layer structure made of Ni, Cu, Au or the like and a two-layer structure, in which a solder material such as Sn, Sn—Pb, Sn—Ag, Sn—Cu and Sn—Zu is laminated on a metal such as Ni, Cu and Au, can be used. Regarding the electrolytic plating treatment, it is not necessary to fill the inside of the hole by plating, and it is sufficient when a thin film is formed in the inside of the hole.

Figure 2F:
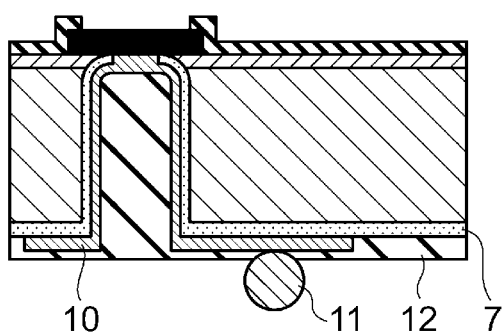

On the metal film 10 of the back surface of the semiconductor wafer 1 formed in this way, a connecting terminal 11 for connecting to an external electrode (not shown) is mounted as shown in FIG. 2F, and a solder resist layer 12 is formed so as to cover conductive portions except for the connecting terminal 11, thereby forming a through electrode. The connecting terminal, the solder resist layer and the method for forming them are not particularly limited as long as they are usually used in the production of semiconductor devices. In the first embodiment of the present invention, by forming the through electrode in this way, it is possible to electrically connect the integrated circuit provided on the surface of the semiconductor wafer and the connecting terminal provided on the back surface of the semiconductor wafer.

Second Embodiment

Next, the second embodiment of the present invention will be described. In the second embodiment of the present invention, a coating film pattern formed using the positive photosensitive resin composition of the present invention is used as a mask for forming a pattern of an insulating film to form an insulating film pattern, and on the obtained insulating film pattern, a metal film for electrically connecting the back surface of the electrode portion and the connecting terminal provided on the back surface of the semiconductor wafer is formed, thereby forming a through electrode.

That is, the second embodiment of the present invention provides a method for producing a through electrode for electrically connecting an integrated circuit provided on the surface of a semiconductor wafer and a connecting terminal provided on the back surface of the semiconductor wafer, comprising:

a coating film forming step in which a coating film is formed by applying the positive photosensitive resin composition of the present invention by means of spray coating so as to cover the inner surface of a hole provided in the thickness direction of the semiconductor wafer so that at least a portion of the back surface of an electrode portion of the integrated circuit provided on the surface of the semiconductor wafer is exposed;

a pattern forming step in which at least a portion of the coating film formed on the back surface of the electrode portion is exposed and thereafter the exposed portion is developed, thereby forming a coating film pattern in which at least a portion of the back surface of the electrode portion is exposed; and a metal film forming step in which an insulating film pattern is formed using the coating film pattern formed in the pattern forming step as a mask for forming the insulating film pattern and a metal film is formed on the obtained insulating film pattern in order to electrically connect the back surface of the electrode portion and the connecting terminal provided on the back surface of the semiconductor wafer.

Hereinafter, the second embodiment of the present invention will be described with reference to the drawings. FIGS. 3A to 3G show a diagram for explaining steps in the method for producing the through electrode according to the second embodiment of the present invention. Letters or numerals in FIGS. 3A to 3G correspond to those in FIGS. 1A to 1C and FIGS. 2A to 2F.

Figure 3A:
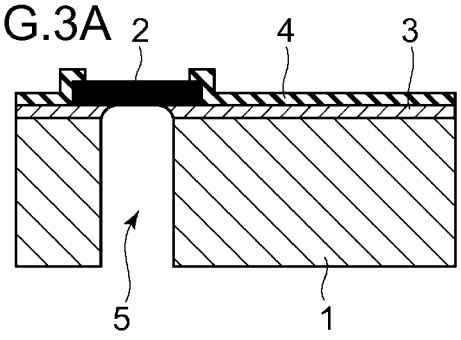
FIGS. 3A to 3G show a diagram for explaining steps in the method for producing the through electrode according to the second embodiment of the present invention.

Firstly, a semiconductor wafer 1, in which a hole 5 is formed in the thickness direction of the semiconductor wafer 1 so that at least a portion of the back surface of an electrode portion 2 of an integrated circuit is exposed, is prepared (see FIG. 3A).

Figure 3B:
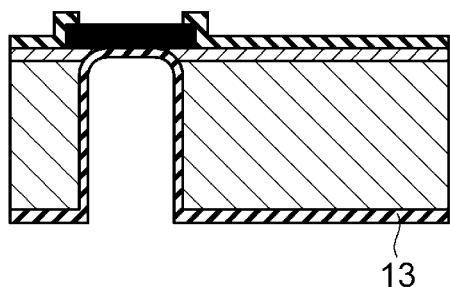

Next, as shown in FIG. 3B), an insulating film 13 is formed so as to cover the inner surface of the hole 5 of the semiconductor wafer 1. The insulating film 13 can be formed using a publicly-known material such as an oxide film ($SiO_2$) according to the chemical vapor deposition method (CVD method) or the like. The thickness of the insulating film is not particularly limited as long as it is sufficient to ensure the insulation properties in the inside of the hole.

Figure 3C:
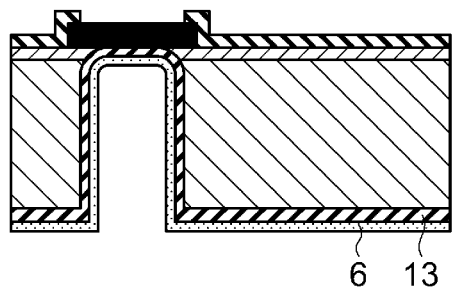
Figure 3D:
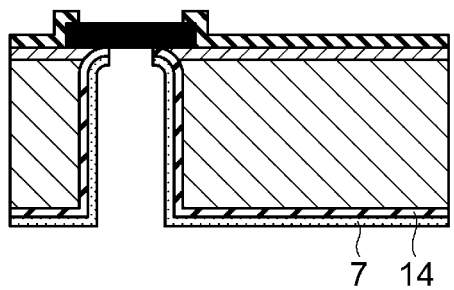

Next, as shown in FIG. 3C), a coating film 6 is formed on the insulating film 13 by applying the positive photosensitive resin composition of the present invention by means of spray coating so as to cover the inner surface of the hole 5. Further, by exposing and developing at least a portion of the back surface of electrode portion 2, a coating film pattern 7, in which at least a portion of the back surface of the electrode portion 2 is exposed, is formed. Further, by removing the exposed portion of the insulating film using this coating film pattern 7 as a mask for forming a pattern of the insulating film 13, an insulting film pattern 14, in which at least a portion of the back surface of the electrode portion 2 is exposed, is formed as shown in FIG. 3D.

The method for removing the exposed portion of the insulating film is not particularly limited, and is preferably a dry etching method. A reactive ion etching (RIE) method is particularly preferred. The method for forming a coating film and the method for forming a coating film pattern are the same as those already described, except that the coating film or coating film pattern is formed on the insulating film.

Figure 3E:
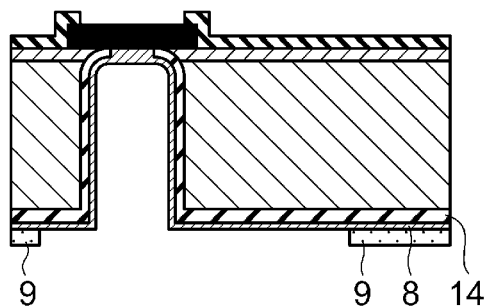

Next, the coating film pattern 7 is removed, and after that, as shown in FIG. 3E, a seed layer 8 is formed in order to form a metal film on the insulating film pattern. Further, on the seed layer 8, a photosensitive film pattern 9, which has an opening at an area for providing a metal film for electrically connecting the back surface of the electrode portion and the connecting terminal provided on the back surface of the semiconductor wafer, is formed. The constituent materials and the formation methods of the seed layer and the photosensitive film pattern are the same as those described for the first embodiment.

Figure 3F:
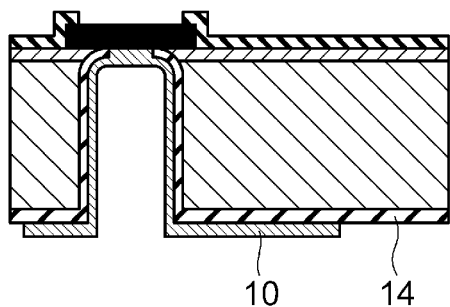

Next, as shown in FIG. 3F, utilizing the seed layer 8 exposed from the opening of the photosensitive film pattern 9 as a plated terminal, the electrolytic plating treatment is performed to form a metal film 10. After that, the photosensitive film pattern 9 is removed and an exposed portion of the seed layer 8 is etched. As the constituent materials of the metal film, the same materials as those explained for the first embodiment can be used.

Figure 3G:
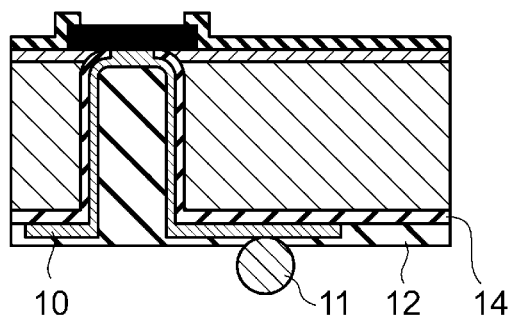

On the exposed portion of the metal film 10 on the back surface of the semiconductor wafer 1 formed in this way, a connecting terminal 11 for connecting to an external electrode is mounted as shown in FIG. 3G, and after that, a solder resist layer 12 is formed so as to cover conductive portions except for the connecting terminal 11, thereby forming a through electrode. The connecting terminal, the solder resist layer and the method for forming them are the same as those explained for the first embodiment. In the second embodiment, by forming the through electrode in this way, it is possible to electrically connect the integrated circuit provided on the surface of the semiconductor wafer and the connecting terminal provided on the back surface of the semiconductor wafer.

Note that FIGS. 1A to 1C, 2A to 2F, and 3A to 3G are a part of examples of the method for producing a through electrode according to the present invention, and the present invention is not limited thereto. The present invention may have other steps usually used in the semiconductor process without departing from the purpose of the present invention, and in this case, other constitutions may be included in a through electrode.

EXAMPLES

Hereinafter, the present invention will be more specifically described by way of examples. However, the present invention is not limited only to these examples.

Example 1

(1) Synthesis of Alkali-Soluble Resin

A mixture of dicarboxylic acid derivative (0.016 mol), which was obtained by reacting 4.13 g (0.016 mol) of diphenylether-4,4'-dicarboxylic acid with 4.32 g (0.032 mol) of 1-hydroxy-1,2,3-benzotriazol, and 7.33 g (0.020 mol) of hexafluoro-2,2-bis(3-amino-4-hydroxyphenyl)propane were put into a four-neck separable flask equipped with a thermometer, a stirrer, a raw material feed port and a dry nitrogen gas introduction tube, and 57.0 g of N-methyl-2-pyrrolidone was added thereto to be dissolved. After that, using an oil bath, a reaction was performed at 75° C. for 12 hours. Next, 1.31 g (0.008 mol) of 5-norbornene-2,3-dicarboxylic anhydride dissolved in 7 g of N-methyl-2-pyrrolidone was added, and the mixture was further stirred for 12 hours and then the reaction was terminated. The reaction mixture was filtered and then the reaction mixture was put into a solution of water/methanol=3/1 (volume ratio), and a precipitate was collected by filtration and washed well with water, followed by drying under vacuum, thereby obtaining an alkali-soluble resin of interest (A-1).

[Chemical Formula 22]

A-1

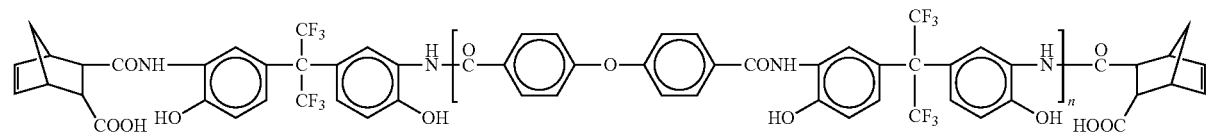

In the formula, n is 15 to 20.

(2) Preparation of Positive Photosensitive Resin Composition for Spray Coating 10 g of the obtained alkali-soluble resin (A-1) and 2 g of a photosensitive diazoquinone compound (B-1) having the following structure, as a compound which generates an acid when exposed to light, were dissolved in 32 g of a solvent (γ-butyrolactone:ethyl acetate:amyl acetate=1:3:2 (weight ratio)). This solution was filtered with a fluorine resin filter having a diameter of 0.2 μm, thereby obtaining a positive photosensitive resin composition having a viscosity of 20 cP.

[Chemical Formula 23]

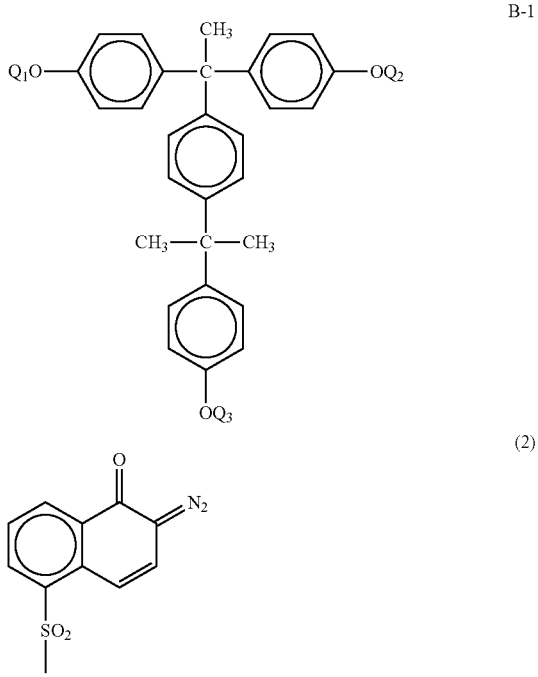

In the formula, 75% of $Q_1$, $Q_2$ and $Q_3$ are groups represented by formula (2), and 25% are hydrogen atoms.

Example 2

A positive photosensitive resin composition was prepared in a manner similar to that in Example 1, except that the solvent (γ-butyrolactone:ethyl acetate:amyl acetate=1:3:2) was replaced by another solvent (γ-butyrolactone:ethyl acetate=15:85).

Example 3

A positive photosensitive resin composition was prepared in a manner similar to that in Example 1, except that the solvent (γ-butyrolactone:ethyl acetate:amyl acetate=1:3:2) was replaced by another solvent (γ-butyrolactone:2-methyltetrahydrofuran=15:85).

Example 4

A positive photosensitive resin composition was prepared in a manner similar to that in Example 1, except that the solvent (γ-butyrolactone:ethyl acetate:amyl acetate=1:3:2) was replaced by another solvent (γ-butyrolactone:ethyl propionate=15:85).

Example 5

A positive photosensitive resin composition was prepared in a manner similar to that in Example 1, except that the solvent (γ-butyrolactone:ethyl acetate:amyl acetate=1:3:2) was replaced by another solvent (γ-butyrolactone:ethyl acetate:t-butyl acetate=15:55:30).

Example 6

A positive photosensitive resin composition was prepared in a manner similar to that in Example 1, except that the solvent (γ-butyrolactone:ethyl acetate:amyl acetate=1:3:2) was replaced by another solvent (γ-butyrolactone:ethyl acetate:propylene glycol monomethyl ether=15:55:30).

Example 7

A positive photosensitive resin composition was prepared in a manner similar to that in Example 1, except that 4 g of spherical silica particles (average particle diameter: 10 nm) were further added to the positive photosensitive resin composition of Example 1.

Example 8

A positive photosensitive resin composition was prepared in a manner similar to that in Example 7, except that the solvent (γ-butyrolactone:ethyl acetate:amyl acetate=1:3:2) was replaced by another solvent (γ-butyrolactone:ethyl acetate=15:85).

Example 9

A positive photosensitive resin composition was prepared in a manner similar to that in Example 7, except that the solvent (γ-butyrolactone:ethyl acetate:amyl acetate=1:3:2) was replaced by another solvent (γ-butyrolactone:2-methyltetrahydrofuran=15:85).

Example 10

A positive photosensitive resin composition was prepared in a manner similar to that in Example 7, except that the solvent (γ-butyrolactone:ethyl acetate:amyl acetate=1:3:2) was replaced by another solvent (γ-butyrolactone:ethyl propionate=15:85).

Example 11

A positive photosensitive resin composition was prepared in a manner similar to that in Example 7, except that the solvent (γ-butyrolactone:ethyl acetate:amyl acetate=1:3:2) was replaced by another solvent (γ-butyrolactone:ethyl acetate:t-butyl acetate=15:55:30).

Example 12

A positive photosensitive resin composition was prepared in a manner similar to that in Example 7, except that the solvent (γ-butyrolactone:ethyl acetate:amyl acetate=1:3:2) was replaced by another solvent (γ-butyrolactone:ethyl acetate:propylene glycol monomethyl ether=15:55:30).

Comparative Example 1

A positive photosensitive resin composition was prepared in a manner similar to that in Example 1, except that the additive amount of the solvent (γ-butyrolactone:ethyl acetate: amyl acetate=1:3:2) was changed to 350 g.

Comparative Example 2

A positive photosensitive resin composition was prepared in a manner similar to that in Example 1, except that the additive amount of the solvent (γ-butyrolactone:ethyl acetate: amyl acetate=1:3:2) was changed to 19 g.

The viscosity of each of the positive photosensitive resin compositions obtained in the above-described Examples and Comparative Examples was measured under the following measurement conditions: a measurement device: TVE-20L form viscosity meter cone plate type (TOKIMEC); a rotor used: a standard rotor (1° 34', R=2.4 cm); a rotation number: 10 rpm; and a temperature: 25° C. The viscosity after 5 minutes was regarded as a measurement value.

Further, regarding the dynamic viscosity ratio of each of the positive photosensitive resin compositions obtained in the above-described Examples and Comparative Examples, dynamic viscosities at respective shear velocities were measured under the following measurement conditions: a measurement device: a viscoelasticity measurement device ARES-2KSTD (Reometric Scientific); a rotor used: a parallel plate type (R=4.0 cm); and a temperature: 25° C. Then calculation was carried out using the formulae described below. The results are shown in Table 1.

Dynamic viscosity ratio $A = \eta 0.1/\eta 100$

Dynamic viscosity ratio $B = \eta 100/\eta 1000$

TABLE 1

|  | Viscosity (cP) | Viscosity ratio A ($\eta 0.1/\eta 100$) | Viscosity ratio B ($\eta 100/\eta 1000$) |
| --- | --- | --- | --- |
| Example 1 | 20 | 1.1 | 1.0 |
| Example 2 | 25 | 1.0 | 1.0 |
| Example 3 | 24 | 1.2 | 1.1 |
| Example 4 | 24 | 1.0 | 1.1 |
| Example 5 | 23 | 1.1 | 1.0 |
| Example 6 | 24 | 1.1 | 1.2 |
| Example 7 | 55 | 87 | 1.9 |
| Example 8 | 63 | 84 | 1.7 |
| Example 9 | 67 | 86 | 1.7 |
| Example 10 | 64 | 86 | 1.8 |
| Example 11 | 59 | 89 | 1.6 |
| Example 12 | 65 | 87 | 1.7 |
| Comparative Example 1 | 0.4 | 1.0 | 1.0 |
| Comparative Example 2 | 220 | 1.1 | 1.1 |

The wet-spreading property of each of the positive photosensitive resin compositions obtained in the above-described Examples 1-12 and Comparative Examples 1 and 2 was evaluated as described below. The silicon wafer used for measurement was such that a contact angle at the time of measurement using γ-butyrolactone was in the range between 89 to 97°.

(1) One drop (15 mg) of each of the positive photosensitive resin compositions obtained in the above-described working examples was dropped on a silicon wafer using a micropipette.
(2) Next, the silicon wafer was arranged and fixed so as to stand with an angle of 80° C. using an angle-adjustable stand and was left for 3 minutes.
(3) 3 minutes later, using a hot plate, heating was performed at 120° C. for 4 minutes, and the positive photosensitive resin composition on the silicon wafer was pre-baked to fix a coating film of the positive photosensitive resin composition.
(4) Regarding the obtained coating film, the dropping length in the vertical direction (length of the coating film in the vertical direction (maximum value)) A and the spreading width in the horizontal direction (length of the coating film in the horizontal direction (maximum value)) B were measured, and the wet-spreading property A/B was calculated. The results are shown in Table 2.

TABLE 2

|  | Dropping length A (mm) | Spreading width B (mm) | Wet-spreading property A/B |
| --- | --- | --- | --- |
| Example 1 | 22 | 15 | 1.5 |
| Example 2 | 66 | 14 | 4.7 |
| Example 3 | 42 | 8 | 5.2 |
| Example 4 | 63 | 13 | 4.8 |
| Example 5 | 62 | 20 | 3.1 |
| Example 6 | 63 | 16 | 3.9 |
| Example 7 | 41 | 14 | 2.9 |
| Example 8 | 48 | 14 | 3.4 |
| Example 9 | 35 | 9 | 3.9 |
| Example 10 | 43 | 12 | 3.6 |
| Example 11 | 49 | 19 | 2.6 |
| Example 12 | 49 | 16 | 3.1 |
| Comparative Example 1 | 150 | 7 | 21.4 |
| Comparative Example 2 | 18 | 15 | 1.2 |

Example 13

Next, a through electrode was formed according to the method for producing a through electrode in the first embodiment of the present invention.

(1) Formation of Via Hole

In the thickness direction of a silicon wafer with a thickness of 300 μm having an aluminium electrode on its surface, using the Bosch process, a via hole having a width of 100 μm was formed from the back surface of the wafer by RIE etching so that at least a portion of the back surface of the aluminium electrode was exposed. As an etching gas, sulfur hexafluoride was used. As a protective gas, octafluorocyclobutene was used. The etching rate was 1 μm/min.

(2) Formation of Coating Film

Next, using a spray gun ("Nano Spray" manufactured by Austria EV Group (EVG)), the positive photosensitive resin composition prepared in Example 1 or 7 was applied to the entire wafer by spray coating with a nitrogen pressure of 1 kg/cm$^2$ so that the inside of the via hole was coated by resin. The sprayed amount of the composition was 0.3 mL/min. The particle diameter of the mist of the composition for coating was set to 5 μm or less. After spray coating, the obtained coating film was pre-baked using a hot plate at 120° C., thereby forming a coating film of about 5 μm.

(3) Formation of Coating Film Pattern

Next, using a mask of a hole pattern with a width of 75 μm, the bottom portion of the via hole was exposed with an i-line stepper and then immersed in a 2.38 TMAH aqueous solution for 50 seconds, followed by washing with pure water for 10 seconds. In this way, an opening of the coating film was formed on the bottom portion of the via hole. The exposure amount was 400 mJ. After that, in a clean oven in which the oxygen concentration was set to 1000 ppm or less, heating was performed at 320° C. for 30 minutes, thereby forming a coating film pattern of about 3 μm.

(4) Formation of Metal Film

By means of sputtering, a seed layer (TiW/NiV/Cu=4000 A/3000 A/5000 A) was formed on the back surface of the wafer and the inner surface of the via hole on which the coating film pattern had been formed.

Next, a resist layer was formed on the seed layer, and exposure and development were performed using a mask of a hole pattern, thereby forming an opening for forming a metal film on the inner surface of the via hole and the back surface of the wafer.

Cu plating was provided to the opening to form a metal film. The resist layer was removed using acetone, and after that, the seed layer was removed by etching using an aqueous solution of hydrofluoric acid and a sulfuric acid-hydrogen peroxide solution.

(5) Formation of Solder Resist Layer

A solder resist layer was formed to cover the inside of the via hole and the back surface of the wafer, and after that, a solder ball was mounted on the metal film of the back surface of the wafer, thereby forming a through electrode.

The silicon wafer on which the through electrode was formed was cut into semiconductor devices. The obtained semiconductor chip was embedded in an epoxy resin to prepare a test piece. After that, the test piece was polished so that the cross-sectional shape of the test piece can be observed, and the cross-sectional shape of the through electrode was observed using a metallograph. As a result, in both the case of using the positive photosensitive resin composition prepared in Example 1 and the case of using the positive photosensitive resin composition prepared in Example 7, it was confirmed that a coating film having a uniform thickness was formed.

Example 14

A through electrode was formed according to the method for producing a through electrode in the second embodiment of the present invention.

(1) Formation of Via Hole

In the thickness direction of a silicon wafer with a thickness of 300 μm having an aluminium electrode on its surface, using the Bosch process, a via hole having a width of 100 μm was formed from the back surface of the wafer by RIE etching so that at least a portion of the back surface of the aluminium electrode was exposed. As an etching gas, sulfur hexafluoride was used. As a protective gas, octafluorocyclobutene was used. The etching rate was 1 μm/min.

(2) Formation of Insulating Film

A $SiO_2$ layer having a thickness of 1000 nm was formed on the back surface of the wafer and the inner surface of the via hole using a chemical vapor deposition method.

(3) Formation of Coating Film

Next, using a spray gun ("Nano Spray" manufactured by Austria EV Group (EVG)), the positive photosensitive resin composition prepared in Example 1 or 7 was applied to the entire wafer by spray coating with a nitrogen pressure of 1 kg/cm$^2$ so that the inside of the via hole was coated by resin. The sprayed amount of the composition was 0.3 mL/min. The particle diameter of the mist of the composition for coating was set to 5 μm or less. After spray coating, the obtained coating film was pre-baked using a hot plate at 120° C., thereby forming a coating film of about 5 μm.

(4) Formation of Coating Film Pattern

Next, using a mask of a hole pattern with a width of 75 μm, the bottom portion of the via hole was exposed with an i-line stepper and then immersed in a 2.38 TMAH aqueous solution for 50 seconds, followed by washing with pure water for 10 seconds. In this way, an opening of the coating film was formed on the bottom portion of the via hole. The exposure amount was 400 mJ. After that, in a clean oven in which the oxygen concentration was set to 1000 ppm or less, heating was performed at 320° C. for 30 minutes, thereby forming a coating film pattern of about 3 μm.

(5) Formation of Insulating Film Pattern

Using the coating film pattern formed as described above as an etching mask, the $SiO_2$ layer on the bottom portion of the via hole was subjected to RIE etching using a $CF_4/O_2$ mixed gas ($CF_4$:$O_2$=180 sccm:20 sccm), thereby forming an opening. As the RIE condition, 600 W/600 sec. was used. After the insulating film pattern was formed, the coating film pattern was immersed in a 10% aqueous solution of hydrofluoric acid for 30 seconds to be removed.

(6) Formation of Metal Film

By means of sputtering, a seed layer (TiW/NiV/Cu=4000 A/3000 A/5000 A) was formed on the back surface of the wafer and the inner surface of the via hole on which the coating film pattern had been formed.

Next, a resist layer was formed on the seed layer, and exposure and development were performed using a mask of a hole pattern, thereby forming an opening for forming a metal film on the inner surface of the via hole and the back surface of the wafer.

Cu plating was provided to the opening to form a metal film. The resist layer was removed using acetone, and after that, the seed layer was removed by etching using an aqueous solution of hydrofluoric acid and a sulfuric acid-hydrogen peroxide solution.

(7) Formation of Solder Resist Layer

A solder resist layer was formed to cover the inside of the via hole and the back surface of the wafer, and after that, a solder ball was mounted on the metal film of the back surface of the wafer, thereby forming a through electrode.

In a manner similar to that in Example 13, the silicon wafer on which the through electrode was formed was cut into semiconductor devices, and the obtained semiconductor chip was embedded in an epoxy resin to prepare a test piece. After that, the test piece was polished so that the cross-sectional shape of the test piece can be observed, and the cross-sectional shape of the through electrode was observed using a metallograph. As a result, in both the case of using the positive photosensitive resin composition prepared in Example 1 and the case of using the positive photosensitive resin composition prepared in Example 7, it was confirmed that a coating film having a uniform thickness was formed.

According to the present invention, it is possible to form a coating film pattern in the inside of a hole having a high aspect ratio formed in the thickness direction of a semiconductor wafer. The obtained coating film pattern is useful as an insulating film for suppressing generation of leakage current in a through electrode or as a mask for pattern formation for forming such an insulating film.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for producing a through electrode for electrically connecting an integrated circuit provided on a surface of a semiconductor wafer and a connecting terminal provided on a back surface of the semiconductor wafer, comprising:

providing the semiconductor wafer having the integrated circuit provided on the surface of the semiconductor wafer and a hole provided in the semiconductor wafer along a thickness direction of the semiconductor wafer, at least a portion of a back surface of an electrode of the integrated circuit being exposed through the hole;

spraying a positive photosensitive resin composition to form a coating film so that the coating film covers an inner surface of the hole, the positive photosensitive resin composition having a viscosity of 0.5 to 200 cP and including an alkali-soluble resin, a compound which generates an acid when exposed to light, and a solvent; and exposing and developing at least a portion of the coating film to form a coating film pattern.

2. The method according to claim 1, further comprising:
forming a metal film on the coating film pattern to electrically connect the back surface of the electrode and the connecting terminal provided on the back surface of the semiconductor wafer.

3. The method according to claim 1, further comprising:
forming an insulating film so that the coating film covers an inner surface of the hole before spraying the positive photosensitive resin composition;
patterning the insulating film to form an insulating film pattern using the coating film pattern as a mask for forming the insulating film pattern; and
forming a metal film on the insulating film pattern to electrically connect the back surface of the electrode and the connecting terminal provided on the back surface of the semiconductor wafer.

4. The method according to claim 1, wherein the dynamic viscosity ratio A ($\eta 0.1/\eta 100$) of the positive photosensitive resin composition is from 1.5 to 400, in which the dynamic viscosity ratio A is a ratio of a dynamic viscosity of $\eta 0.1$ at a shear rate of 0.1/s to a dynamic viscosity of $\eta 100$ at a shear rate of 100/s, and the dynamic viscosity ratio B ($\eta 100/\eta 1000$) of the positive photosensitive resin composition is from 0.6 to 5.0, in which the dynamic viscosity ratio B is a ratio of the dynamic viscosity of $\eta 100$ to a dynamic viscosity of $\eta 1000$ at a shear rate of 1000/s.

5. The method according to claim 1, wherein the solvent comprises a first solvent having a boiling point of 140° C. to 210° C. and a second solvent having a boiling point of 50° C. to 140° C.

6. The method according to claim 5, wherein the first solvent dissolves the alkali-soluble resin and the second solvent improves the volatile property of the positive photosensitive resin composition.

7. The method according to claim 5, wherein the first solvent comprises γ-butyrolactone.

8. The method according to claim 5, wherein the second solvent comprises ethyl acetate, 2-methyltetrahydrofuran, ethyl propionate, t-butyl acetate, propylene glycol monomethyl ether, 3-methyltetrahydrofuran, s-butyl acetate, n-butyl acetate, isobutyl acetate, or a mixture thereof.

9. The method according to claim 5, wherein a content of the second solvent is 50 to 95 wt % of an entire solvent.

10. The method according to claim 1, wherein the solvent comprises a first solvent having a boiling point of 140° C. to 210° C. and a second solvent having a boiling point of 50° C. to 120° C.

11. The method according to claim 1, wherein the alkali-soluble resin is
a resin having at least one of a polybenzoxazole structure and a polyimide structure, wherein the main chain or side chain thereof has a hydroxyl group, a carboxyl group, an ether group, an ester group, or a combination thereof;
a resin having a polybenzoxazole precursor structure;
a resin having a polyimide precursor structure;
a resin having a polyamic acid ester structure; or
a combination thereof.

12. The method according to claim 1, wherein a content of the alkali-soluble resin is 0.1 to 50 wt % of an entire composition.

13. The method according to claim 1, wherein the compound which generates an acid when exposed to light comprises an ester compound obtained by reacting a phenol compound with one of 1,2-naphthoquinone-2-diazide-5-sulfonic acid and 1,2-naphthoquinone-2-diazide-4-sulfonic acid.

14. The method according to claim 1, wherein a content of the compound which generates an acid when exposed to light is 1 to 50 wt % of a content of the alkali-soluble resin.

15. The method according to claim 1, wherein the wet-spreading property, which is defined by a ratio A/B between the maximum value A of the dropping length in the vertical direction and the maximum value B of the spreading width in the horizontal direction of a coating film that is obtained by dropping 15 mg of the positive photosensitive resin composition on a silicon wafer in which a contact angle at the time of measurement using γ-butyrolactone is 89 to 97° and arranging and fixing the silicon wafer so as to stand with an angle of 80° to be left for 3 minutes, is 0.1 to 20.

* * * * *